(12) United States Patent
Rikyuu et al.

(10) Patent No.: US 6,547,844 B2
(45) Date of Patent: Apr. 15, 2003

(54) EXHAUST GAS FILTRATION DEVICE, AUXILIARY FILTRATION DEVICE AND TRAP DEVICE

(75) Inventors: Toshihiro Rikyuu, Tokyo (JP); Keisuke Nagakura, Tokyo (JP)

(73) Assignee: Anelva Corporation (JP)

( * ) Notice: Subject to any disclaimer, the term of this patent is extended or adjusted under 35 U.S.C. 154(b) by 0 days.

(21) Appl. No.: 09/734,000

(22) Filed: Dec. 12, 2000

(65) Prior Publication Data

US 2001/0003892 A1 Jun. 21, 2001

(30) Foreign Application Priority Data

Dec. 15, 1999 (JP) .......................................... 11-356334
Mar. 15, 2000 (JP) ........................................ 2000-072313

(51) Int. Cl.[7] .............................................. B01D 45/08
(52) U.S. Cl. ...................... 55/315.1; 55/434.2; 55/446; 55/464; 55/DIG. 15
(58) Field of Search ........................ 55/321, 323, 325, 55/434.2, 434.3, 434.4, 445, 446, 462, 464, 465, DIG. 15, 315.1, 315.2; 62/55.5

(56) References Cited

U.S. PATENT DOCUMENTS

| | | | | | |
|---|---|---|---|---|---|
| 512,681 | A | * | 1/1894 | Clute | 55/446 |
| 1,867,325 | A | * | 7/1932 | Neville | 422/177 |
| 3,623,828 | A | * | 11/1971 | Shapiro | 417/2 |
| 4,488,887 | A | * | 12/1984 | Angel et al. | 55/446 |
| 4,506,513 | A | * | 3/1985 | Max | 55/434.4 |

* cited by examiner

*Primary Examiner*—Robert A. Hopkins
(74) *Attorney, Agent, or Firm*—Venable; James R. Burdett

(57) ABSTRACT

The present invention has an object to improve the efficiency of collection of solidification constituents and solids in exhaust gas and to prevent early blockage of the filter without damaging the vacuum pump. In an exhaust path 48a, a vacuum pump and exhaust gas filtration device are provided. This exhaust gas filtration device is constituted by a trap device, pre-filter and filter. The pre-filter reduces the exhaust gas flow rate flowing through the interior of the exhaust path by controlling the exhaust gas flow path in the vessel. The aforesaid exhaust path is constituted by connecting this vacuum pump, trap device, pre-filter and filter which are arranged in this order from the side of airtight vessel and connected through piping if required.

65 Claims, 15 Drawing Sheets

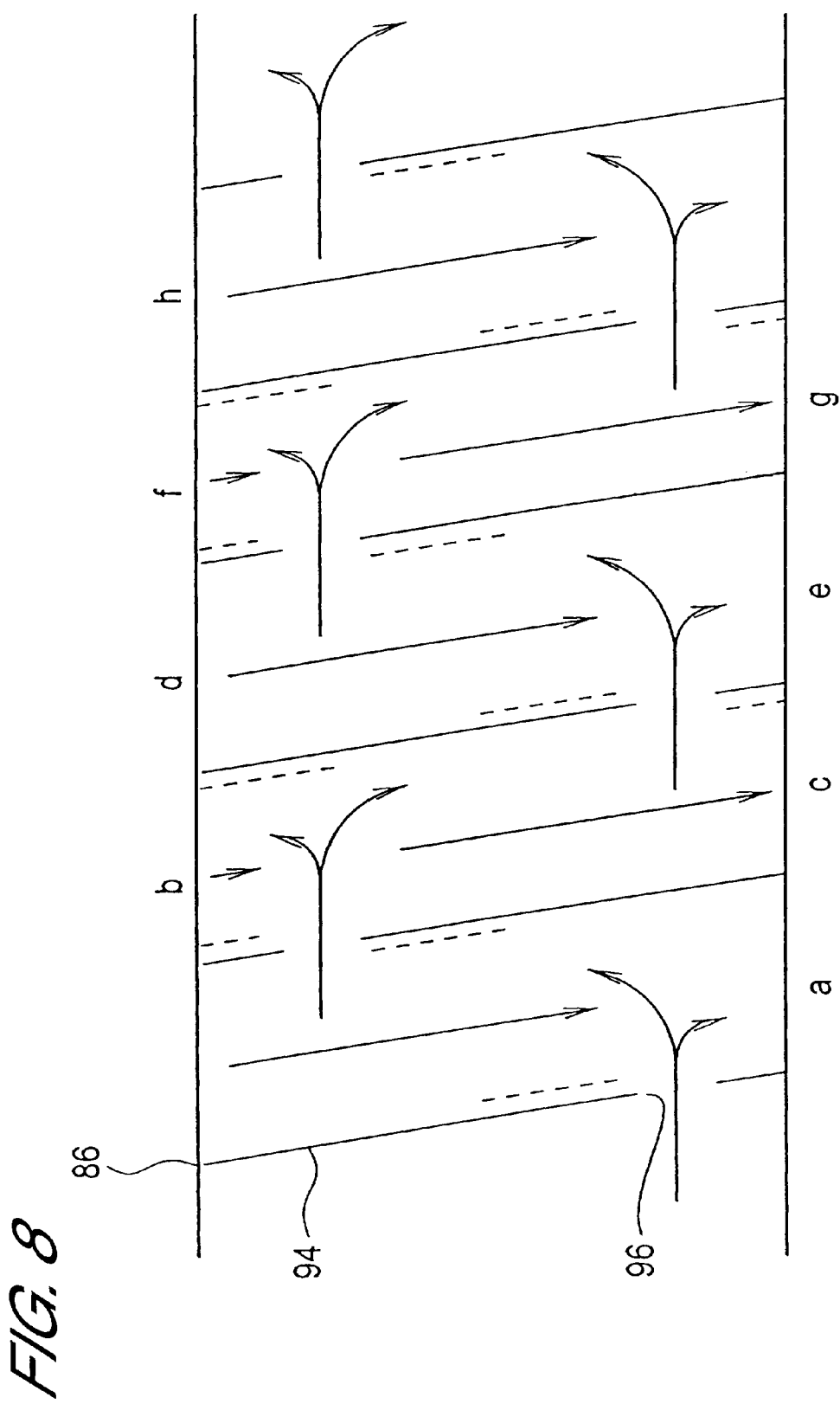

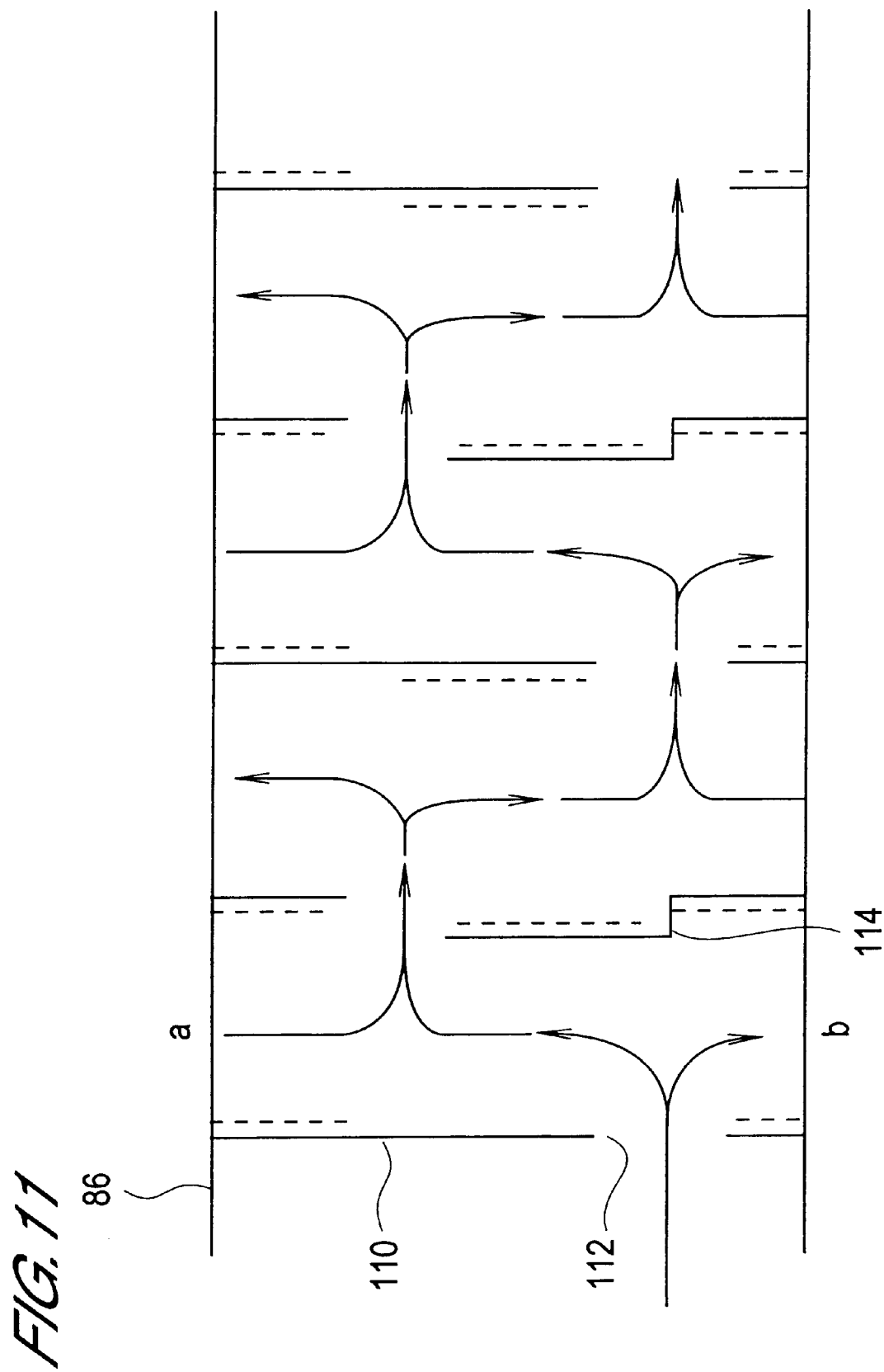

EXHAUST GAS FILTRATION DEVICE, AUXILIARY FILTRATION DEVICE AND TRAP DEVICE

BACKGROUND OF THE INVENTION

1. Field of the Invention

The present invention relates to an exhaust gas filtration device for removing solidification constituents and solids in exhaust gas, which is provided in the exhaust path of a gas treatment chamber employed in a step of manufacturing semiconductor elements or electronic components.

2. Description of Related Art

In, for example, plasma CVD equipment which is used in the manufacture of semiconductor elements or electronic components, a plasma CVD process occurs in an airtight vessel, and an a-Si film or SiN film, etc is deposited on a substrate. In this process, apart from on the substrate, the thin film is also deposited on the inside wall, etc. of the airtight vessel. Usually, the thin film that is deposited on the inside wall, etc. is removed by plasma cleaning using $NF_3$ gas. In this process, gaseous products chiefly represented by $Si_2F_6(NH_4)_3 \cdot F^*$ are produced in the airtight vessel. Evacuation of the airtight vessel is continued during plasma cleaning, so powder-form solids chiefly represented by $Si_2F_6(NH_4)_3 \cdot F^*$ are precipitated and deposited on the piping, etc. constituting the exhaust path. Such deposition of solids tends to cause blockage of the piping. In order to prevent this, an exhaust gas filtration device is provided in the exhaust path with the object of removing solidification constituents (gaseous products whose condition is changed to a solid by cooling or by densification (raised pressure)) and solids in the exhaust gas.

FIG. 13 is a block diagram illustrating a conventional exhaust gas filtration device. FIG. 13(A) shows an airtight vessel 10 and exhaust path 12a of this airtight vessel. A vacuum pump 14 and exhaust gas filtration device 16 are arranged in this exhaust path 12a. This conventional exhaust gas filtration device 16 comprises a trap device 18 and filter 20. The exhaust path 12a referred to above is constituted by connecting this vacuum pump 14, trap device 18 and filter 20 in this order from airtight vessel 10 by means of piping in accordance with requirements.

Also, the exhaust path 12b shown in FIG. 13(B) consists of trap device 18, filter 20 and vacuum pump 14 connected in this order through piping, as required, from airtight vessel 10. In this way, for the order of arrangement of the exhaust gas filtration device 16 and vacuum pump 14 an order may be employed that is the opposite of that of FIG. 13(A).

As the trap device 18 described above, for example trap devices constructed as shown in FIG. 14 and FIG. 15 are known. FIG. 14 and FIG. 15 are cross-sectional views illustrating the construction of typical trap devices.

The trap device shown in FIG. 14 comprises a cylindrical vessel (casing) 22 having apertures at both ends. One aperture of this vessel 22 is employed as a gas inlet port 24 and the other aperture of this vessel 22 is employed as a gas outlet port 26, respectively. Within vessel 22, there is provided a cylindrical baffle plate 28 which is closed at one end. Baffle plate 28 is arranged in the vicinity of the middle of the interior of vessel 22, with its closed end facing gas inlet port 24. Within this baffle plate 28, there is provided a cooling pipe 30 comprising a cooling medium inlet port 30a and cooling medium outlet port 30b. Also, on the wall surface of vessel 22, there is provided a cooling pipe 32 comprising a cooling medium inlet port 32a and cooling medium outlet port 32b. A cooling medium such as water is circulated in these cooling pipes 30 and 32.

Exhaust gas evacuated from the airtight vessel flows from gas inlet port 24 into the interior of vessel 22 and, passing between the inside wall of vessel 22 and baffle plate 28, flows from gas outlet port 26 into the downstream exhaust path. This exhaust gas carries heat. On the other hand, vessel 22 and baffle plate 28 are cooled to a temperature lower than the temperature of the exhaust gas by means of cooling pipes 30 and 32. As a result, the exhaust gas solidifies in the vessel 22, and products generated within the airtight vessel are precipitated as solids. These solids are deposited on the wall surface of vessel 22 and the surface of baffle plate 28.

Also, in the trap device shown in FIG. 15, a cooling pipe 34 comprising a cooling medium inlet port 34a and cooling medium outlet port 34b is provided within vessel 22. This cooling pipe 34 is of a shape that is bent a plurality of times, so the contact area between the exhaust gas and cooling pipe 34 is increased, and the efficiency of collection of the solidification constituents and solids is increased.

Next, a typical example of the construction of the filter 20 referred to above is illustrated in FIG. 16. FIG. 16(A) is a cross-sectional view showing an example of construction of the filter. FIG. 16(B) is a perspective view with part of this filter disassembled.

The filter shown in FIG. 16 comprises a cylindrical vessel 36 having two apertures 38 and 40. The first aperture 38 of this vessel 36 is used as a gas inlet aperture and the second aperture 40 of this vessel 36 is used as a gas outlet aperture, respectively. In this example, the second aperture 40 is formed at one end of vessel 36 while the first aperture 38 is formed in the cylindrical surface nearer to the other end of vessel 36.

A filter mesh 42 is provided in the interior of vessel 36. This filter mesh 42 is constituted by winding a stainless steel plain fabric diamond wire diameter mesh (hereinbelow abbreviated to "mesh") 44 onto the outside of a stainless-steel cylindrical frame 46 (in a condition in which frame 46 is inserted facing in the direction shown by arrow a in FIG. 16(B)). This filter mesh 42 is arranged such that its inside (on the side of frame 46) communicates with second aperture 40 and its outside (on the side of mesh 44) communicates with first aperture 38. A plurality of apertures 46a are formed on the cylindrical surface of frame 46 so that exhaust gas that flows into the first aperture 38 passes through the mesh 44 of filter mesh 42 and reaches the second aperture 40. Solids in the exhaust gas are captured by mesh 44.

Also, first aperture 38 could be used as a gas outlet port and second aperture 40 could be used as a gas inlet port. In this case, the exhaust gas flows into the second aperture 40, and the exhaust gas passes through the mesh 44 of filter mesh 42 before flowing out to the outside from first aperture 38.

However, the conventional exhaust gas filtration devices suffer from the following problems.

1) In the trap devices described above, the solidification constituents or solids in the exhaust gas cannot be completely removed. In order to remove the solidification constituents or solids, it is necessary to cool the exhaust gas, thereby inevitably bringing the solidification constituents or solids in the exhaust gas into contact with cooling parts of the trap device. It is therefore difficult to remove fine particulate products (solids) that do not flow through the vicinity of the cooling parts. Also, even if they do come into contact, it is difficult for fine particulate products that are flowing past with high speed to be deposited and accumulated.

2) The products described above that are not captured by the trap device are removed by a filter provided downstream of the trap device. However, although this filter is able to remove the fine particulate products due to the fact that it consists of fibrous members of a fine close construction, it is easily blocked even by a very small quantity of particulate products, severely lowering the conductance of the exhaust path. When the conductance has been lowered to a certain degree, it is necessary to wash or change the structural components of the exhaust gas filtration device. Consequently, due to the employment of a filter, the period of continuous use of the exhaust gas filtration device and the semiconductor manufacturing equipment employing is shortened.

3) In order to solve the problem of 2) above, the amount of fine particular products flowing into the filter must be reduced. Noting that the collection efficiency of the trap device is inversely proportional to the flow velocity of the exhaust gas flowing through the interior, it might be considered that it would be effective to deliberately reduce the conductance at an arbitrary position within the exhaust path. However, if the conductance is lowered to such a level as to solve the problem of 2) above, the load applied to the vacuum pump becomes large, giving rise to the fresh problem of damage to the vacuum pump.

4) Also, in the conventional trap devices, there was local accumulation of solids on the cooling pipes in the vicinity of the gas inlet aperture but scarcely any accumulation of the solids was found on cooling pipes remote from the gas inlet aperture. Consequently, reduction in the conductance of the gas flow path due to accumulation of solids proceeds locally in the vicinity of the inlet port. This therefore shortens the time of use until the trap device must be changed or washed, and means that satisfactory performance in regard to collection efficiency is not achieved.

The object of the invention of this application is therefore to provide an exhaust gas filtration device and auxiliary filtration device aiming at improving the collection efficiency of solidification constituents and solids in exhaust gas, yet in which the period of continuous use can be extended without damaging the vacuum pump.

A further object of this application is to provide a trap device in which the period of use of the device can be extended and the collection efficiency of solids can be improved by promoting deposition of solids at locations other than the vicinity of the gas inlet port.

SUMMARY OF THE INVENTION

In order to achieve this object, an exhaust gas filtration device according to the present invention comprising a trap device and a filter arranged successively in an exhaust path of an airtight vessel evacuated by a vacuum pump, for removing solidification constituents and solids in the exhaust gas evacuated into this exhaust path, further comprises: an auxiliary filtration device arranged in the exhaust path between the trap device and the filter.

By thus providing an auxiliary filtration device, some of the solids which were difficult to collect and accumulate by the trap device are removed by this auxiliary filtration device upstream of the filter. Consequently, early blockage of the filter can be prevented, enabling the life of the exhaust gas filtration device as a whole to be extended.

Also, by the provision of an auxiliary filtration device, the conductance of the exhaust path can be deliberately reduced to an extent such that the vacuum pump is not damaged. As a result, the flow velocity of exhaust gas within the trap device is lowered i.e. the dwell time of exhaust gas within the trap device is extended, and the collection efficiency for solidification constituents and solids in the trap device is improved.

Also, according to the invention of the auxiliary filtration device, there are provided a vessel, exhaust gas inlet pipe, exhaust gas outlet pipe and filter element constituting a device for removal of solids in exhaust gas discharged into an exhaust path and arranged in this exhaust path of an airtight vessel evacuated by a vacuum pump.

According to the present invention, this filter element is a sponge-like aggregate constituted by collecting a large number of strip-shaped or filamentous members.

Also, according to the present invention, the interior of the vessel and the exhaust path are connected by an exhaust gas inlet pipe and exhaust gas outlet pipe.

Furthermore, according to the present invention, a filtration region, a first diffusion region and second diffusion region are defined in the interior of the vessel, and the first and second diffusion regions are separated from each other by a filter element arranged in the filtration region.

Furthermore, according to the present invention, the end of the exhaust gas inlet pipe constitutes a gas inlet port and is arranged in either the first or second diffusion region, and the end of the exhaust gas outlet pipe constitutes a gas outlet port and is arranged in either the first or second diffusion region.

Furthermore, according to the present invention, the exhaust gas flow path extending from the gas inlet port to the gas outlet port is constructed such that exhaust gas passes through the filter element at least once.

Usually, this auxiliary filtration device is arranged between the trap device and the filter. The filter element that is installed in this auxiliary filtration device is a member that captures principally comparatively large fine products (solids) that are not removed by the trap device and that cause blockage of the filter.

With such an auxiliary filtration device, the exhaust gas flows into the first or second diffusion region through the exhaust gas inlet pipe. After this, the exhaust gas passes through the filter element and reaches the gas outlet port arranged in the first or second diffusion region. The exhaust gas is then fed to the downstream waste path by the exhaust gas outlet pipe. In this process, solids in the exhaust gas are removed.

Also, thanks to the provision of the filter element, the conductance of the exhaust path at the position where the filter element is arranged is lowered. The flow velocity of the exhaust gas flowing through the exhaust path upstream of the position where the conductance is lowered is therefore reduced. As a result, the efficiency of collection of solidification constituents and solids in the other filtration device arranged upstream of this auxiliary filtration device is improved.

Preferably in the auxiliary filtration device of the present invention, part of the through-flow path of the exhaust gas constitutes a path whereby exhaust gas flows in the opposite direction to the direction in which exhaust gas is evacuated from the airtight vessel.

With such an arrangement, the direction of through-flow of the exhaust gas from the gas inlet port to the gas outlet port is practically opposite to the direction of inflow of exhaust gas into the vessel from the gas inlet port and to the direction of outflow of exhaust gas to the gas outlet port from the interior of the vessel. The flow velocity of the exhaust gas flowing through the interior of the exhaust path upstream of the auxiliary filtration device is thereby further reduced, as a result of which the efficiency of collection of solidification constituents and solids in the other filtration device arranged upstream of this auxiliary filtration device can be expected to be further improved.

Also, in a preferred example of the auxiliary filtration device of the present invention, it is preferable that the gas inlet port is arranged in the first diffusion region and the gas outlet port is arranged in the second diffusion region, the exhaust gas inlet pipe being coupled to the exhaust path through a partition on the side of the second diffusion region of the vessel, while the exhaust gas outlet pipe is coupled to the exhaust path through a partition on the side of the first diffusion region of the vessel.

With this arrangement, a portion of the exhaust gas through-flow path becomes a path whereby the exhaust gas flows in the opposite direction to the direction whereby the exhaust gas is evacuated from the airtight vessel.

Also, in another preferred example of the auxiliary filtration device of the present invention, it is preferable that a partition that divides the first diffusion region into an exhaust gas inlet region and an exhaust gas outlet region, and the filtration region into two, namely, a first and second filtration region, is provided in the vessel; the gas inlet port is arranged in the exhaust gas inlet region and the gas outlet port is arranged in the exhaust gas outlet region; the exhaust gas inlet pipe is coupled with the exhaust path through a partition on the side of the second diffusion region of the vessel; and the exhaust gas outlet pipe is coupled with the exhaust path through a partition on the side of the first diffusion region of the vessel.

With this arrangement, a portion of the exhaust gas through-flow path becomes a path whereby the exhaust gas flows in the opposite direction to the direction whereby the exhaust gas is evacuated from the airtight vessel.

Also, preferably, in the auxiliary filtration device of the present invention, the filter element is constituted by a plurality of metal strips which are packed substantially uniformly between a plurality of support plates having at least one aperture.

Furthermore, in implementation of the auxiliary filtration device of the present invention, preferably a cooling mechanism is provided for cooling the filter element.

Also, it has been noted that generation of solids depends also on pressure, not solely on temperature.

Specifically, in a trap device according to the invention relating to the present application, a trap device arranged on an exhaust path of an airtight vessel evacuated by a vacuum pump, for removing solidified gas as solid in this exhaust path, is constituted by a vessel having in its interior a gas flow path connected to the exhaust path, the flow velocity of gas in the flow path being controlled to a prescribed flow rate in accordance with position on this flow path.

In this way, the flow velocity of gas is controlled in accordance with flow path position, so accumulation of solids is promoted where the flow velocity is comparatively small. On the other hand, accumulation of solids is avoided where the flow velocity is comparatively large. It is therefore possible to cause solids to be accumulated at prescribed positions on the flow path and to prevent accumulation of solids at locations where lowering of the conductance of the flow path is not desired. Accumulation of solids can thereby be promoted in locations other than the vicinity of the gas inlet port, thereby enabling the period of use of the device to be extended and also improving the efficiency of collection of solids.

In a preferred example of the trap device of the present invention, the flow path comprises a main flow path extending in helical fashion and an auxiliary flow path branched from part of this main flow path and connected to another part of this main flow path.

With such a construction, the gas flowing in the main flow path is slowed down by the gas flowing in from the auxiliary flow path at points where the main flow path and auxiliary flow path merge. The dwell time of the gas in the device is thereby extended and accumulation of solids is promoted. Also, accumulation of solids in the main flow path is promoted as the period of use of the device increases, causing the cross-sectional area of the flow path to be reduced, but, since the gas flows into the downstream part of the main flow path through the auxiliary flow path, the downstream part of the main flow path can also be effectively utilized. Consequently, the period of use of the device can be extended compared with conventionally.

Also, in a trap device according to the present invention, preferably, the aforementioned main flow path is formed by a thin plate connected to the surface of a shaft element provided in the interior of the vessel, and the auxiliary flow path is formed by an aperture formed at a prescribed position of the thin plate.

Also, in another preferred example of the trap device of the present invention, the flow path comprises a plurality of annular first flow paths and second flow paths connected between the first flow paths, and the flow path cross-sectional area of the first flow paths is changed at prescribed positions.

If such a construction is adopted, the gas flows in each of the first flow paths and second flow paths. The gas flowing into the first flow paths from the second flow paths is branched into two streams. Due to the provision of prescribed locations where the flow path cross-sectional area changes in the first flow paths, the gas proceeds through respective locations where the flow path cross-sectional area is small and where the flow path cross-sectional area is large. In locations where the flow path cross-sectional area is small, the gas flow velocity becomes faster than where the flow path cross-sectional area is larger. Consequently, it is more difficult for solids to accumulate in the locations where the flow path cross-sectional area is small, while, on the other hand, solids accumulate more easily where the flow path cross-sectional area is large. Thus, locations where accumulation of solids is promoted and locations where lowering of the conductance is prevented can be set up at prescribed positions. Consequently, it is possible to induce non-local accumulation of solids, so that the downstream sections of the first flow paths are also effectively used. Consequently, the period of use of the device is longer than conventionally.

Also, preferably, in a trap device according to the present invention, the first flow path is formed by a plurality of thin plates connected to the surface of a shaft element arranged in the interior of the vessel, the second flow path is formed by apertures formed in prescribed positions of the thin plates, and the flow path cross-sectional area of the first flow paths is changed by forming a step at a prescribed position of the thin plates.

Also, preferably, the thin plates are bent in irregular or undulating fashion. This is because the surface area of the thin plates is thereby increased, increasing the effective area on which solids can be accumulated. Also, the gas flow path is extended, enabling the period of use of the device to be extended and the collection efficiency of solids to be improved.

Furthermore, preferably, an irregular structure is formed in the surface of said thin plates. In order to achieve this, for example, an irregular surface may suitably be formed by subjecting the surface of the thin plates to blast processing. As a result, the surface area of the thin plates is increased.

Furthermore, suitably, a cooling mechanism may be provided in the interior of the shaft element referred to above.

BRIEF DESCRIPTION OF THE DRAWINGS

FIG. 8 is a view provided to describe the operation of the trap device of the third embodiment;

FIG. 11 is a view provided to describe the operation of the trap device of the fourth embodiment;

DESCRIPTION OF THE PREFERRED EMBODIMENTS

Figure 1A:
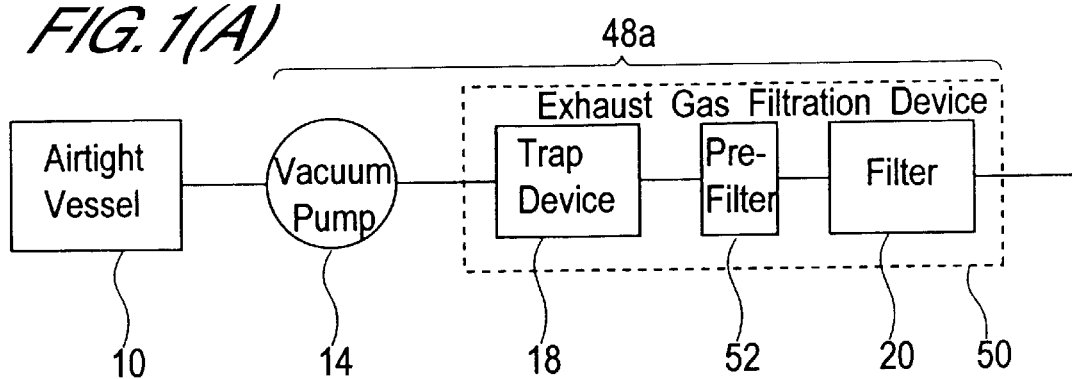
FIG. 1 is a view showing the construction of an exhaust gas filtration device according to an embodiment.

Embodiments of the invention are described below with reference to the drawings. The drawings illustrate schematically the shape, dimensions and arrangement relationships of the various structural components in order to enable the present invention to be understood. In the drawings used in the description below, the same reference symbols are attached to similar structural components. The numerical value conditions and materials set out below merely constitute one example. Accordingly, the present invention is not restricted in any way to these embodiments.

The exhaust gas filtration device of this embodiment is a device arranged in the exhaust path of an airtight vessel that is evacuated by a vacuum pump for removal of the solidification constituents (gaseous products) and solids in the exhaust gas discharged into this exhaust path.

FIG. 1 is a block diagram illustrating the construction of the exhaust gas filtration device of the embodiment.

In FIG. 1(A), there are shown an airtight vessel 10 and an exhaust path 48a of this airtight vessel. In this exhaust path 48a there are provided a vacuum pump 14 and exhaust gas filtration device 50 of this embodiment. This exhaust gas filtration device 50 comprises a trap device 18, pre-filter (auxiliary filtration device. Also called a pre-filtration device) 52 and a filter 20. A special feature of this exhaust gas filtration device 50 is that a pre-filter 52 is newly provided between the trap device and filter constituting a conventional exhaust gas filtration device. The exhaust path 48a referred to above is constituted by connecting this vacuum pump 14, trap device 18, pre-filter 52 and filter 20 in this order from the airtight vessel 10 through piping if required.

Figure 1B:
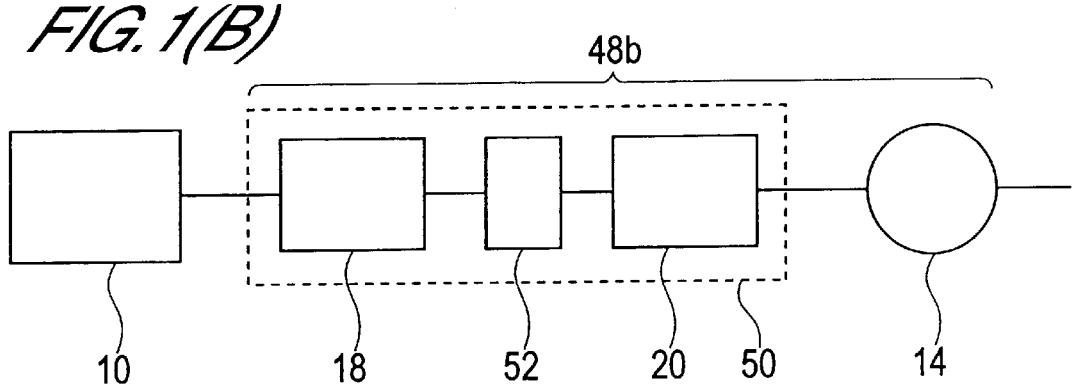

Also, the exhaust path 48b shown in FIG. 1(B) is constituted by connecting exhaust gas filtration device 50 and vacuum pump 14 in this order from the airtight vessel 10 through piping if required. In this way, the order of arrangement of exhaust gas filtration device 50 and vacuum pump 14 is the opposite to that in which they are used in the case of FIG. 1(A).

Figure 1C:
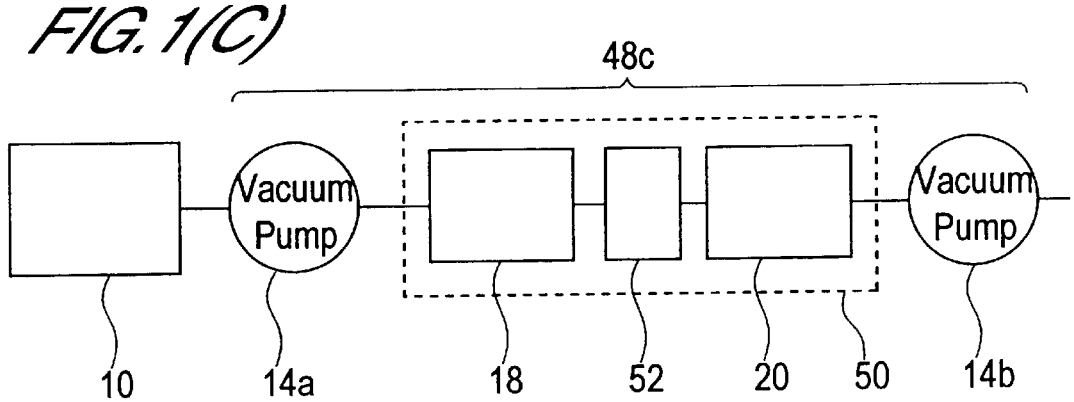

Further, for the exhaust path 48c shown in FIG. 1(C), vacuum pump 14a, exhaust gas filtration device 50 and vacuum pump 14b are connected in this order from airtight vessel 10 through piping if required. Thus, vacuum pumps may be provided both upstream and downstream of exhaust gas filtration device 50. In general, as the upstream vacuum pump 14a, a pump suited for creating a medium vacuum or high vacuum condition, such as, for example, a turbo-molecular pump, is employed, whereas for the downstream vacuum pump 14b, a pump suited for creating a vacuum condition from atmospheric pressure, such as for example a dry pump is employed.

Figure 14:
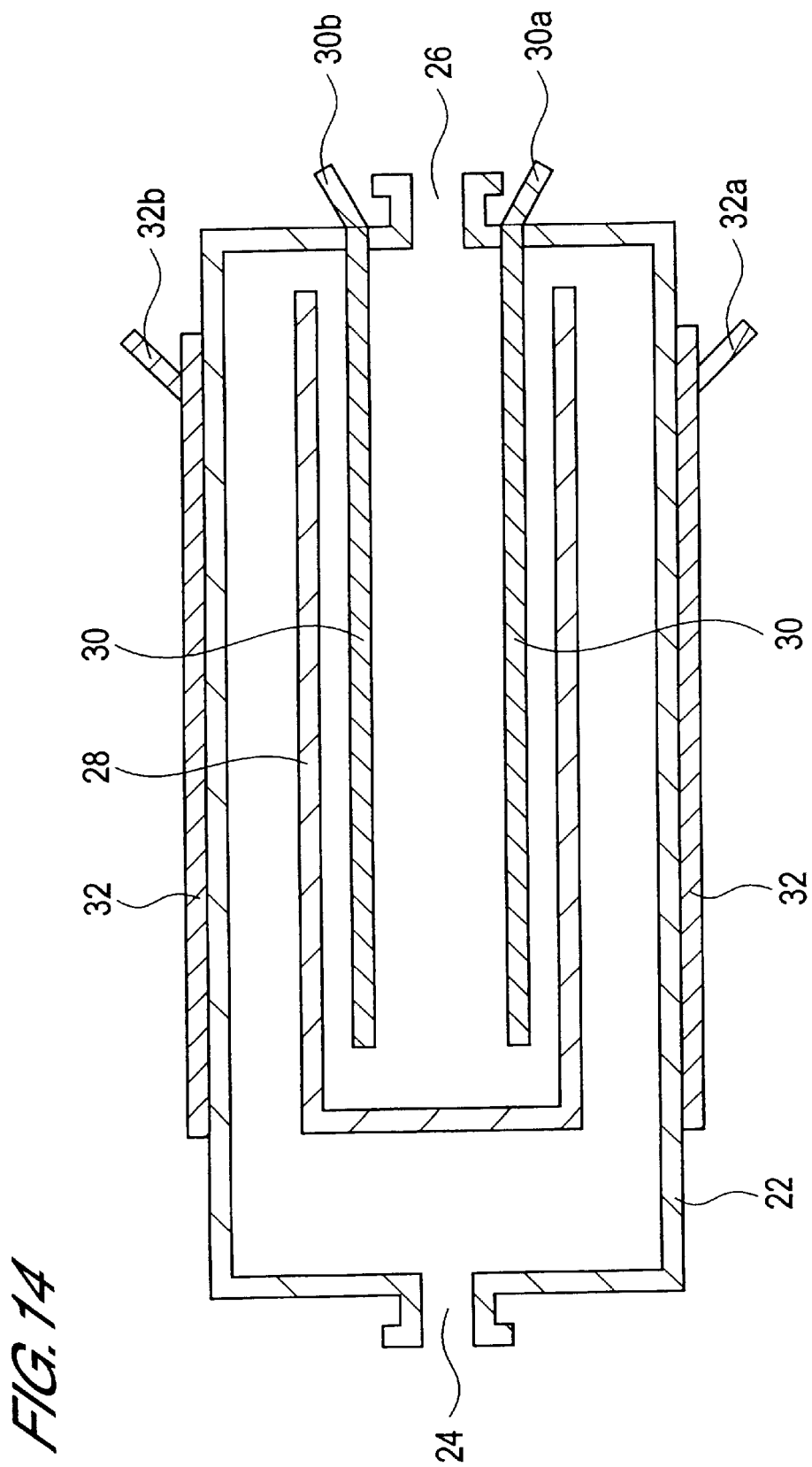
FIG. 14 is a view showing the construction of a typical trap device.
Figure 15:
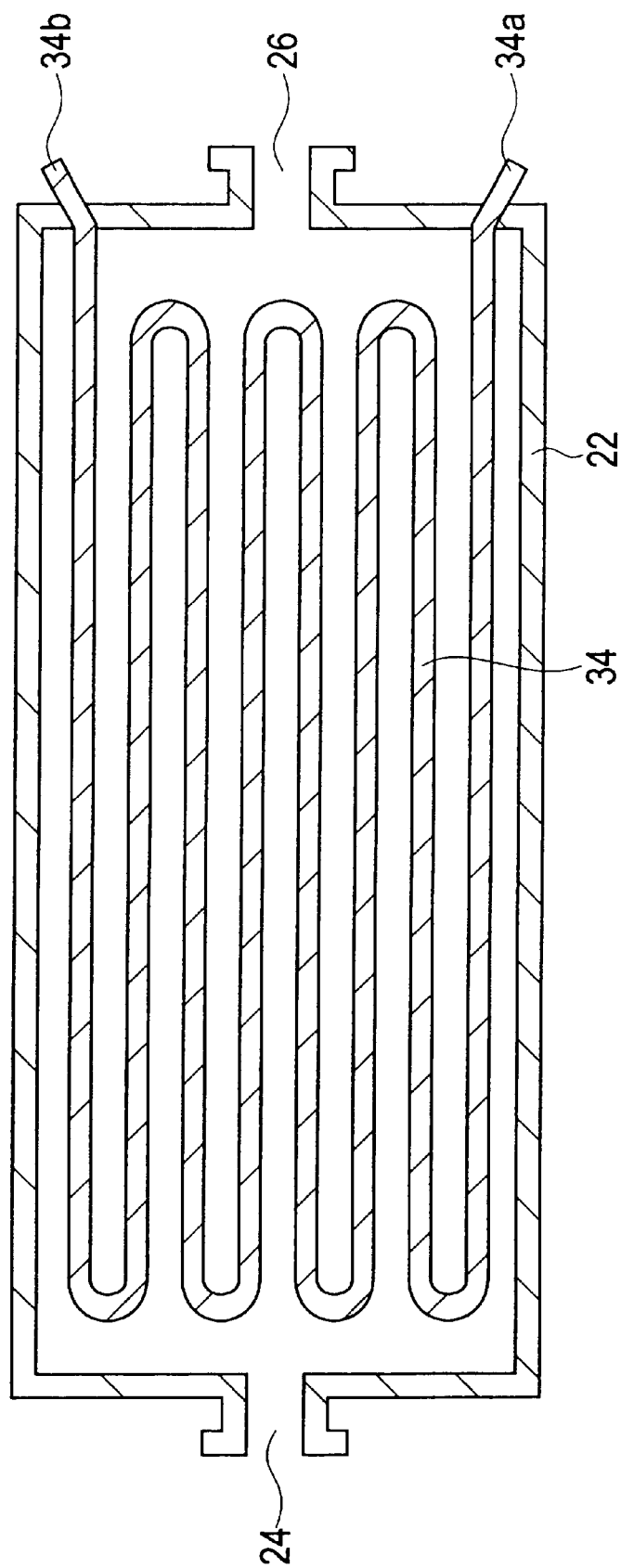
FIG. 15 is a view showing the construction of a typical trap device.
Figure 16A:
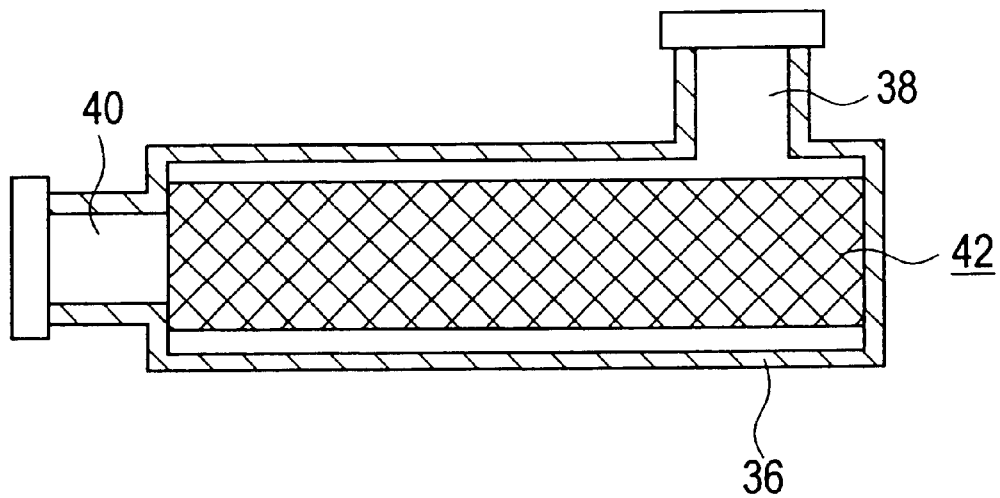
FIG. 16 is a view showing the construction of a typical filter.
Figure 16B:
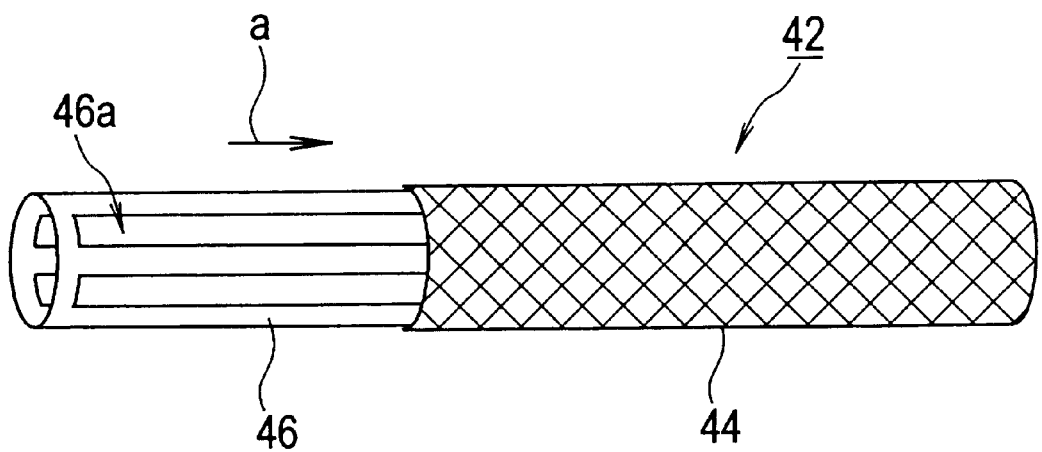

As the trap device 18 described above, for example a trap device as described with reference to FIG. 14 and FIG. 15 may be employed. Apart from this, trap devices according to the third and fourth embodiment, to be described, may be employed. Also, as filter 20 described above, for example the filter described with reference to FIG. 16 may be employed.

First Embodiment

Figure 2:
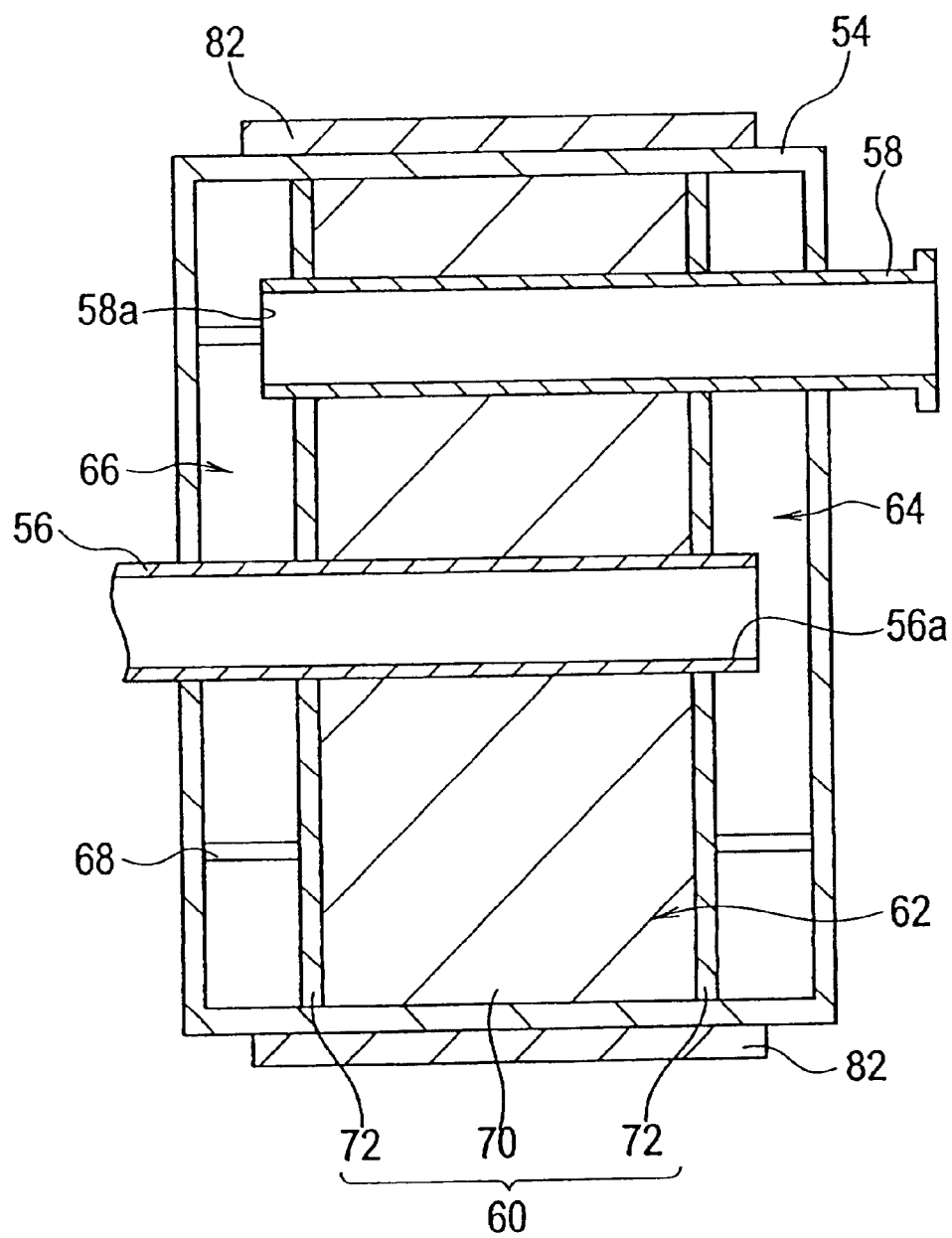
FIG. 2 is a view showing the construction of a pre-filter according to a first embodiment.
Figure 3:
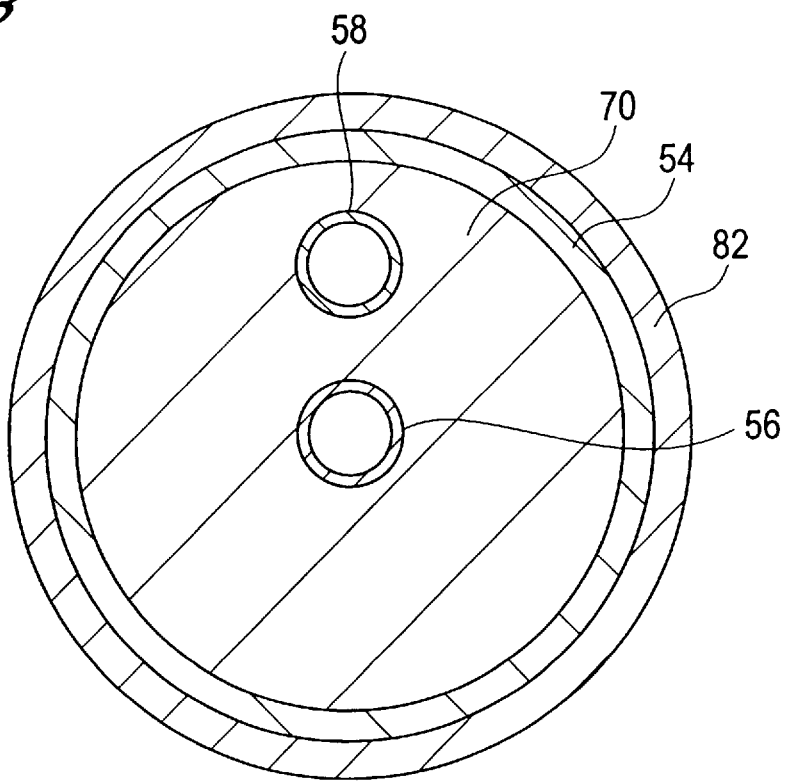
FIG. 3 is a view showing the construction of a pre-filter according to a first embodiment.
Figure 4:
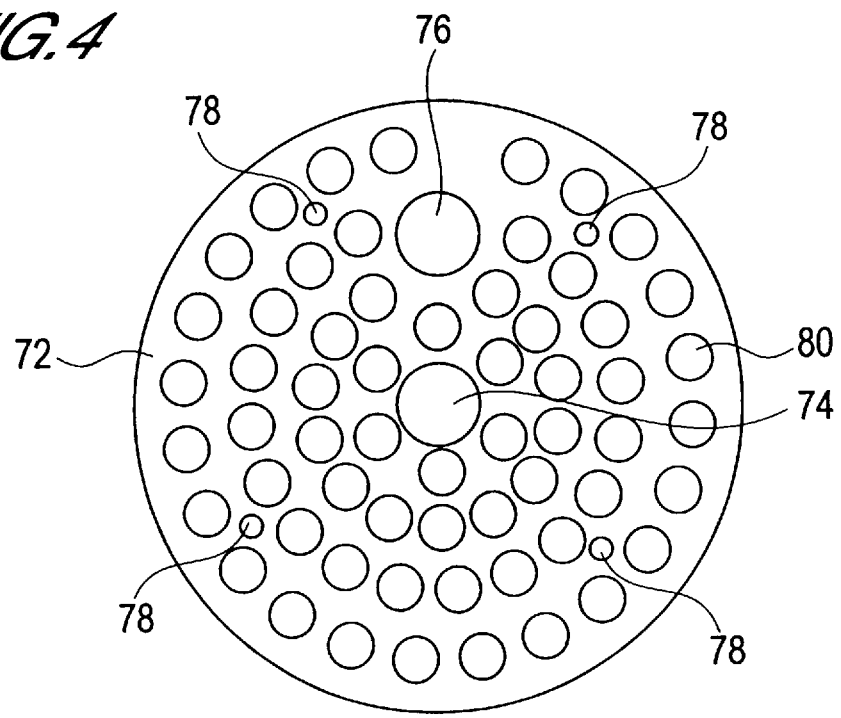
FIG. 4 is a view showing the construction of a support plate.

Next, a first embodiment of pre-filter 52 described above will be described with reference to FIG. 2, FIG. 3 and FIG. 4. FIG. 2 is a cross-sectional view illustrating the construction of a pre-filter according to a first embodiment. The cross-sectional view shown in FIG. 3 illustrates a cross section cut perpendicularly with respect to the direction of-extension of exhaust gas inlet pipe 56 and exhaust gas outlet pipe 58 of the portion of the filtration region 62 of the pre-filter shown in FIG. 2. Also, FIG. 4 is a plan view illustrating the construction of support plate 72 shown in FIG. 2.

As shown in FIG. 2, this pre-filter chiefly comprises vessel 54, exhaust gas inlet pipe 56, exhaust gas outlet pipe 58 and filter element 60.

Vessel 54 is a cylindrically shaped vessel having one aperture at each of its two ends, respectively. An exhaust gas inlet pipe 56 is inserted in one aperture of this vessel 54, while an exhaust gas outlet pipe 58 is inserted in the other aperture. The interior of vessel 54 and the exhaust path are connected by means of this exhaust gas inlet pipe 56 and exhaust gas outlet pipe 58. Prescribed sealing is effected in the region of the apertures of vessel 54 through which this exhaust gas inlet pipe 56 and exhaust gas outlet pipe 58 pass, in order to maintain gas tightness within vessel 54.

A filtration region 62, first diffusion region 64 and second diffusion region 66 are defined in the interior of vessel 54. This first and second diffusion regions 64 and 66 are isolated by means of a filter element 60 provided in filtration region 62. This filter element 60 is constituted by a sponge-like assembly in which a large number of members of tape or filament form are collected together. Such a filter element 60 has the function of capturing solids in exhaust gas. This filter element 60 is supported by a plurality of support pillars 68 in the vicinity of the center of vessel 54.

Exhaust gas inlet pipe 56 and exhaust gas outlet pipe 58 referred to above are respectively arranged so as to extend linearly within vessel 54. Also, exhaust gas inlet pipe 56 is coupled to the exhaust path through a partition on the side of the second diffusion region 66 of the vessel 54 and exhaust gas outlet pipe 58 is coupled to the exhaust path through a partition on the side of the first diffusion region 64 of vessel 54.

The end of the exhaust gas inlet pipe 56 mentioned above is gas inlet port 56a and is arranged within the first diffusion region 64. Also, the end of exhaust gas outlet pipe 58 referred to above is a gas outlet port 58a and is arranged within second diffusion region 66.

Consequently, the through-flow path of exhaust gas from gas inlet port 56a to gas outlet port 58a is constituted such that the exhaust gas passes at least once through filter element 60.

Furthermore, part of this exhaust gas through-flow path, in particular the path when the exhaust gas passes through filter element 60, constitutes a path whereby the exhaust gas flows in a direction opposite to the direction in which the exhaust gas is evacuated from airtight vessel 10. That is, the direction whereby the exhaust gas flows through from gas inlet port 56a to gas outlet port 58a is a direction practically opposite to the direction of the inflow of the exhaust gas from gas inlet port 56a into vessel 54 and to the direction of exhaust gas outflow from vessel 54 to gas outlet port 58a.

Next, a specific construction of filter element 60 referred to above will be described. The filter element 60 of this example is constituted by packing a plurality of metal strips between a plurality of support plates 72 having apertures substantially uniform such that exhaust gas can flow therethrough. In the example shown in FIG. 2 and FIG. 3, metal wool 70 constituting an assembly of metal strips is packed in the space between two support plates 72 of the same shape.

The metal strips constituting metal wool 70 are obtained by cutting processing of metal such as stainless steel into the form of strips of arbitrary length, width 2 mm and thickness about 0.1 mm. Such metal wool 70 has a sponge-like structure like a metal brush. The shape of the metal strips is not restricted to the example described above, but could be of any desired shape. For example, they could be made of filamentous shape or could be wound in helical fashion. Furthermore, glass strips could be used instead of the metal strips.

Exhaust gas can flow through the interior of such metal wool 70 and the contact area between the metal wool 70 and the exhaust gas is extremely large. Consequently, any solids in the exhaust gas that have not been completely removed in the trap device can be removed by capture by the metal wool 70.

The support plates 72 consist of disc shaped stainless steel plates. A plurality of through-holes are formed in support plate 72. In the middle of the disc of a support plate 72, there is formed a circular inlet aperture port 74 through which exhaust gas inlet pipe 56 is passed. Also, in a support plate 72 there is formed a circular outlet aperture port 76 through which exhaust gas outlet pipe 58 passes. Also, in support plates 72, there are formed a plurality, in this example, four, of support pillar apertures 78 through which are inserted support pillars 68 for supporting filter element 60. Furthermore, a large number of through-flow apertures 80 are formed in support plates 72 to allow passage of exhaust gas.

The external diameter of these support plates 72 (disc diameter) is equal to the internal diameter of vessel 54. The two support plates 72 are arranged parallel to each other fitted into the interior of vessel 54. Exhaust gas inlet pipe 56, exhaust gas outlet pipe 58 and support pillars 68 are respectively inserted into the apertures 74, 76 and 78 of the support plates 72 described above in a condition with the support plates 72 arranged in vessel 54. Furthermore, the metal wool 70 described above is packed between the exhaust gas inlet pipe 56, exhaust gas outlet pipe 58 and supporting pillars 68 between the two support plates 72 as shown in FIG. 3 (however, supporting pillars 68 are not shown in FIG. 3).

Also, in this pre-filter, with the object of obtaining a precipitation effect of the solidification constituents in filter element 60, a cooling mechanism for cooling filter element 60 i.e. support plates 72 and metal wool 70 is provided. As this cooling mechanism, a cooling pipe 82 for circulation of cooling medium such as water is employed. The construction is such that cooling pipe 82 is arranged at the outside surface of vessel 54, filter element 60 being cooled through the partition of vessel 54.

Next, the operation of this pre-filter will be described.

First of all, exhaust gas evacuated from the trap device flows into exhaust gas inlet pipe 56. The exhaust gas flows into first diffusion region 64 within vessel 54 through gas inlet port 56a of exhaust gas inlet pipe 56. The direction of inflow of the exhaust gas is then a direction away from filtration region 62 in vessel 54.

Next, exhaust gas is diffused in first diffusion region 64. The diffused exhaust gas flows in the opposite direction to the direction of inflow and arrives at the second diffusion region 66 by passing through the interior of the filter element 60 arranged in filtration region 62. In this process, solidification constituents and solids in the exhaust gas are removed in filter element 60.

Next, the exhaust gas in the second diffusion region 66 is allowed to flow to the outside of vessel 54 by means of exhaust gas outlet pipe 58, passing through gas outlet port 58a.

Thus, with this pre-filter, since filter element 60 is arranged in the through-flow path of the exhaust gas, the flow velocity of the exhaust gas flowing through the interior of the trap device upstream of this pre-filter is lowered and as a result the dwell time of the exhaust gas in the trap device is prolonged. Consequently, the collection efficiency for solidification constituents and solids in the trap device is improved.

Furthermore, with this pre-filter, the direction in which the exhaust gas flows through the filter element 60 is controlled in a direction practically opposite to the direction in which the exhaust gas flows from gas inlet port 56a into vessel 54 and the direction in which the exhaust gas flows out from the interior of vessel 54 into gas outlet port 58a. As a result, the flow velocity of the exhaust gas flowing through the interior of the trap device upstream of the pre-filter is further reduced, so the efficiency of collection of solidification constituents and solids in the trap device is further improved.

Second Embodiment

Figure 5:
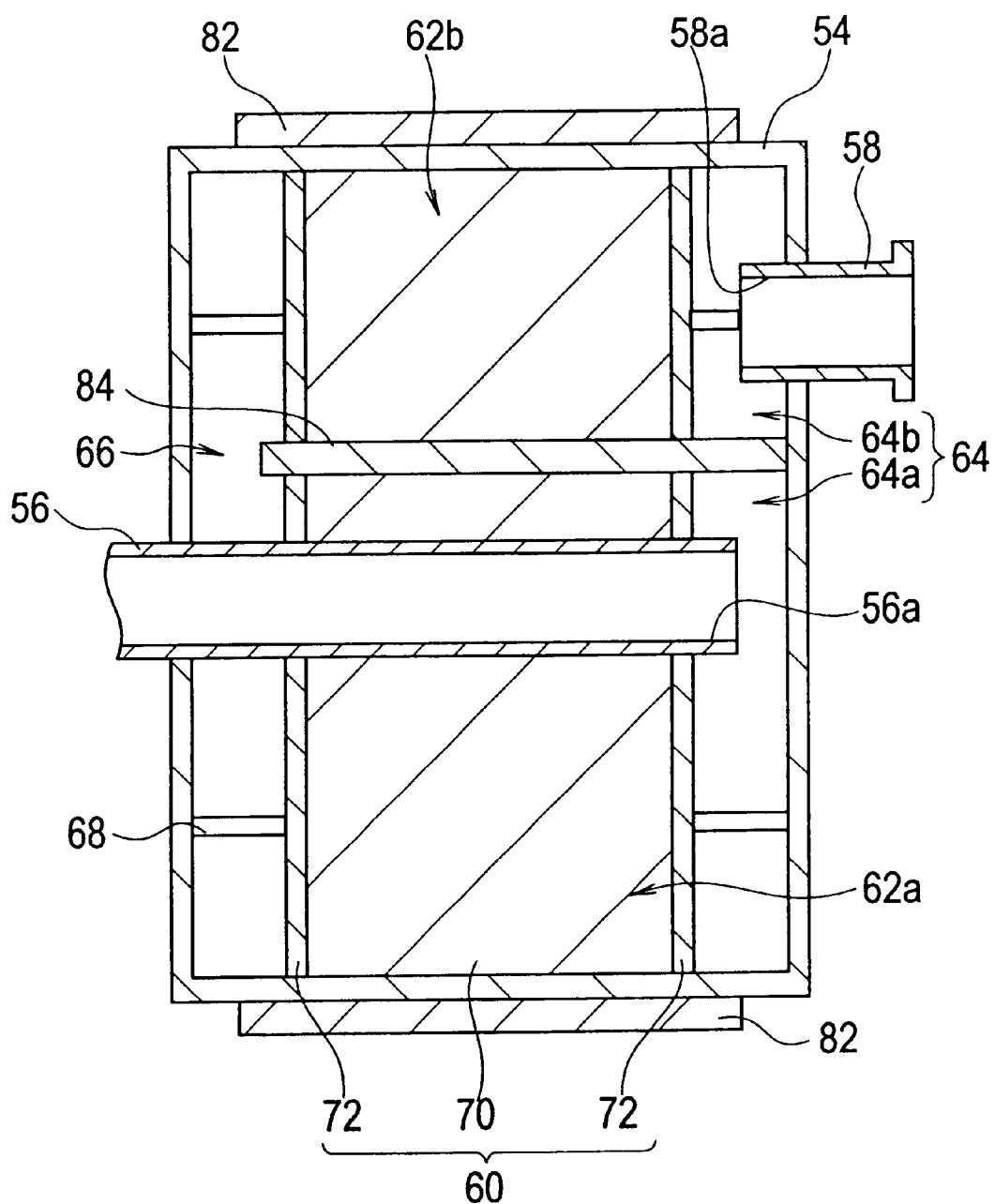
FIG. 5 is a view showing the construction of a pre-filter according to a second embodiment.

Next, a second constructional example of pre-filter 52 referred to above will be described with reference to FIG. 5. FIG. 5 is a cross-sectional view showing the construction of a pre-filter according to a second embodiment. Hereinbelow, the description will be concentrated on those aspects of this second constructional example which are different from the first constructional example.

In the pre-filter of this constructional example, a partition 84 for separating the first diffusion region 64 into an exhaust gas inlet region 64a and exhaust gas outlet region 64b is provided in vessel 54. This partition 84 is arranged between this exhaust gas inlet pipe 56 and exhaust gas outlet pipe 58 in a condition parallel to exhaust gas inlet pipe 56 and exhaust gas outlet pipe 58.

Gas inlet port 56a is arranged in exhaust gas inlet region 64a and gas outlet port 58a is arranged in exhaust gas outlet region 64b.

Also, the filtration region 62 is divided by the aforementioned partition 84 into two, namely, first filtration region 62a and second filtration region 62b. Exhaust gas inlet pipe 56 is arranged so as to extend within the first filtration region 62a on the side of the exhaust gas inlet region 64a.

Consequently, the through-flow path of exhaust gas from gas inlet port 56a to gas outlet port 58a is constituted such that the exhaust gas passes at least once through filter element 60.

Furthermore, part of this exhaust gas through-flow path, in particular the path when the exhaust gas passes through first filtration region 62a, constitutes a path whereby the exhaust gas flows in a direction opposite to the direction in which the exhaust gas is evacuated from airtight vessel 10. That is, the direction whereby the exhaust gas flows through from gas inlet port 56a to gas outlet port 58a is a direction practically opposite to the direction of the inflow of the exhaust gas from gas inlet port 56a into vessel 54 and to the direction of exhaust gas outflow from vessel 54 to gas outlet port 58a.

Next, the operation of this pre-filter will be described.

First of all, exhaust gas evacuated from the trap device flows into exhaust gas inlet pipe 56. The exhaust gas flows into exhaust gas inlet region 64a within vessel 54 through gas inlet port 56a of exhaust gas inlet pipe 56. The direction of inflow of the exhaust gas is then a direction away from first filtration region 62a in vessel 54.

Next, exhaust gas is diffused in exhaust gas inlet region 64a. The diffused exhaust gas flows in the opposite direction to the direction of inflow and arrives at the second diffusion region 66 by passing through the interior of the filter element 60 arranged in first filtration region 62a. In this process, solidification constituents and solids in the exhaust gas are removed in filter element 60.

Next, the exhaust gas in the second diffusion region 66 is allowed to flow to exhaust gas outlet region 64b by passing through the filter element 60 arranged in second filtration region 62b. In this process, solidification constituents and solids in the exhaust gas are further removed in filter element 60.

Next, the exhaust gas in the exhaust gas outlet region 64b is allowed to flow to the outside of vessel 54 by means of exhaust gas outlet pipe 58, passing through gas outlet port 58a.

Thus, with this pre-filter, since filter element 60 is arranged in the through-flow path of the exhaust gas, the flow velocity of the exhaust gas flowing through the interior of the trap device upstream of this pre-filter is lowered and as a result the dwell time of the exhaust gas in the trap device is prolonged. Consequently, the collection efficiency for solidification constituents and solids in the trap device is improved.

Furthermore, with this pre-filter, the direction in which the exhaust gas flows through the filter element 60 arranged in the first filtration region 62a is controlled in a direction practically opposite to the direction in which the exhaust gas flows from gas inlet port 56a into vessel 54 and the direction in which the exhaust gas flows out from the interior of vessel 54 into gas outlet port 58a. As a result, the flow velocity of the exhaust gas flowing through the interior of the trap device is further reduced, so the efficiency of collection of solidification constituents and solids in the trap device is further improved.

It should be noted that, although the pre-filter of the second constructional example was used in a condition with the exhaust gas inlet pipe 56 coupled with the exhaust path on the side of the trap device and exhaust gas outlet pipe 58 coupled with the exhaust path on the filter side, it could be used with these reversed. Specifically, exhaust gas inlet pipe 56 could be coupled with the exhaust path on the filter side, while exhaust gas outlet pipe 58 is coupled with the exhaust path on the trap device side.

In the exhaust gas filtration device described above, a trap device is employed together with a pre-filter. Consequently, the pre-filter may suitably be incorporated on the exhaust gas port side of the trap device.

Depending on the conditions of the process such as CVD performed in the airtight vessel (in particular on the type of gas employed and/or the set temperature), in some cases, solidification constituents may not be generated, only solids being produced (although solidification constituents may be generated, they immediately change in state to solids). In this case, an exhaust gas filtration device may be constituted consisting solely of a pre-filter and filter, without using a trap device.

Third Embodiment

Figure 6A:
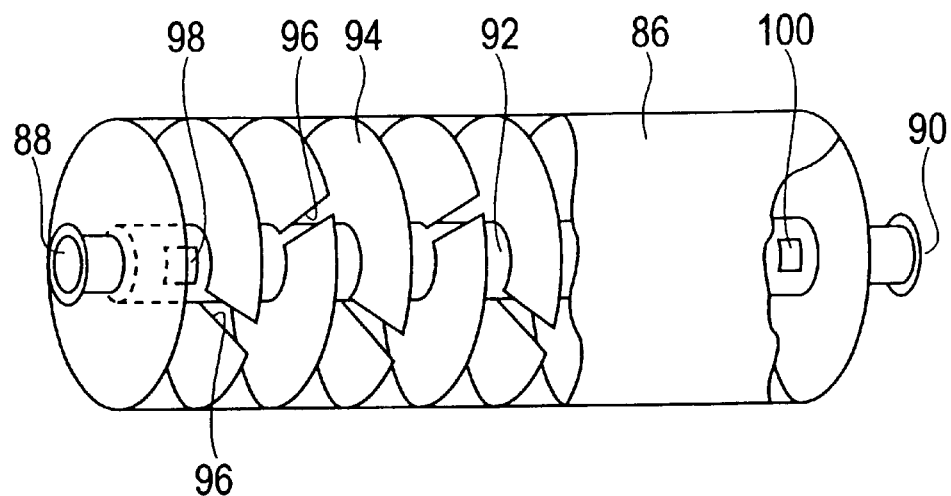
FIG. 6 is a view showing the construction of a trap device according to a third embodiment.
Figure 6B:
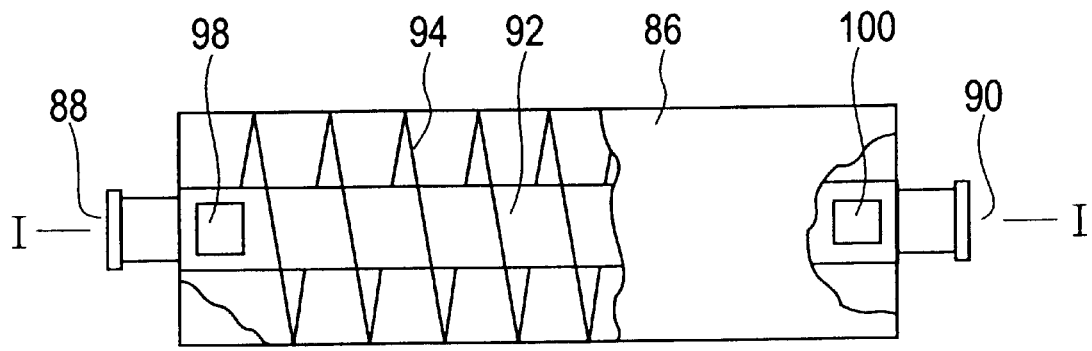

Next, a trap device according to a third embodiment will be described. FIG. 6 is a view showing the construction of the trap device according to the third embodiment. FIG. 6(A) shows a perspective view of the trap device and FIG. 6(B) shows a side view of the trap device.

The trap device shown in FIG. 6 is constituted by a vessel (casing) 86 of cylindrical shape provided with apertures at both ends. One aperture of vessel 86 is employed as a gas inlet port 88, while the other aperture of vessel 86 is employed as a gas outlet port 90. This gas inlet port 88 and gas outlet port 90 are respectively connected to the exhaust path. Also, a flow path of gas (gas mixture) connected to the exhaust path is formed between gas inlet port 88 and gas outlet port 90 within vessel 86. This trap device is arranged in the exhaust path described above such that gas inlet port 88, the flow path and gas outlet port 90 are arranged in the horizontal direction.

In the trap device of this embodiment, the flow velocity of the gas in the flow path described above is controlled to a prescribed flow velocity in accordance with the position of this flow path. In order to achieve this, in the third embodiment, the flow path described above is constituted by a main flow path extending in helical fashion and an auxiliary flow path branched from part of this main flow path and connected to another portion of this main flow path. In the third embodiment, the main flow path described above is formed by a thin plate 94. This thin plate 94 is connected to the surface of a cylindrically shaped shaft element 92 provided within vessel 86. Also, the auxiliary flow path mentioned above is formed by apertures 96 (not shown in FIG. 6(B)) formed at a prescribed positions of thin plate 94.

Shaft element 92 referred to above is arranged at a position such that the central axis of this shaft element 92 coincides with the central axis of vessel 86. One end of shaft element 92 is connected to a wall portion on the side of gas inlet port 88 of vessel 86, while the other end of shaft element 92 is connected to a wall portion on the gas outlet port 90 side of vessel 86. Gas inlet port 88 and gas outlet port 90 respectively communicate with the interior of shaft element 92. Also, apertures 98 and 100 are respectively formed in the wall face in the vicinity of both ends of shaft element 92. Consequently, these apertures 98 and 100 respectively communicate with gas inlet port 88 and gas outlet port 90. It should be noted that, although not shown in FIG. 6, a cooling mechanism 102 is provided between apertures 98 and 100 within shaft element 92. The interior of shaft element 92 between apertures 98 and 100 is blocked by this cooling mechanism 102. It is therefore impossible for gas entering gas inlet port 88 to be fed to gas outlet port 90 by flowing through the interior of shaft element 92. That is, gas entering gas inlet port 88 is fed into the interior of vessel 86 through aperture 98 on the side of gas inlet port 88, passes through the flow path in vessel 88 and is fed to the exhaust path from gas outlet port 90, passing through the aperture 100 on the side of gas outlet port 90.

Also, the thin sheet 94 referred to above is a single sheet extending in helical shape centered on shaft element 92 from the side of gas inlet port 88 to the side of gas outlet port 90. The space between the adjacent parts of this thin plate 94 is employed as the main flow path referred to above. Gas that is fed into vessel 86 from the side of gas inlet port 88 flows in helical fashion centered on shaft element 92 along the main flow path towards gas outlet port 90.

Also, as described above, auxiliary flow paths are formed by apertures 96 formed in prescribed positions of thin plate 94. That is, these auxiliary flow paths constitute flow paths that are branched from part of the main flow path and connected to another portion of this main flow path. Gas that is introduced into vessel 86 from gas inlet port 88 flows along the main flow path towards the gas outlet port 90 and part of the gas becomes a branched flow into the auxiliary flow paths, flowing along the axial direction of shaft element 92.

Cooling mechanism 102 referred to above will now be described with reference to FIG. 7. FIG. 7 is a cross-sectional view showing the construction of the cooling mechanism. Hatching indicating the cross section is not shown in the Figure. Also, the cross-sectional plane shown in FIG. 7 is a cross-sectional plane corresponding to a cut at a position including the central axis of shaft element 92 shown in FIG. 6(B) (position of the line I—I of FIG. 6(B)).

Figure 7A:
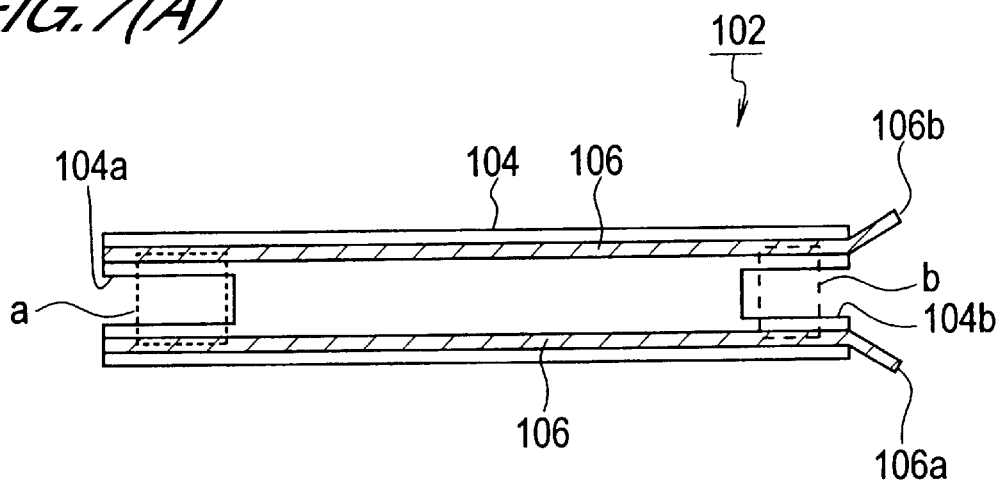
FIG. 7 is a view showing the construction of a cooling mechanism.

As shown in FIG. 7(A), the cooling mechanism 102 referred to above is constituted of a cylindrical shaped rod-shaped member 104. This rod-shaped member 104 is formed fitting into the interior of shaft element 92, being formed with respective cut-away portions 104a and 104b at both its ends. These cut-away portions 104a and 104b are formed such that, when rod-shaped member 104 is fitted into the interior of shaft element 92, apertures 98 and 100 of shaft element 92 are respectively aligned with the positions of cut-away portions 104a and 104b. Consequently, even though rod-shaped member 104 is inserted into the interior of shaft element 92, respectively connected conditions are produced between gas inlet port 88 and aperture 98 and between gas outlet port 90 and aperture 100. The positions of apertures 98 and 100 when rod-shaped member 104 is fitted into the interior of shaft element 92 are respectively indicated by broken lines a and b in FIG. 7.

Also, a cooling pipe 106 is embedded in the interior of the rod-shaped member 104. Both end portions of this cooling pipe 106 are led to the outside of rod-shaped member 104 and are respectively employed as cooling medium inlet port 106a and cooling medium outlet port 106b. The direction of elongation of rod-shaped member 104 arranged in shaft element 92 coincides with the horizontal direction and it is arranged in a condition with cooling medium inlet port 106a and cooling medium outlet port 106b disposed in the vertical direction. Also, in this condition, cooling medium outlet port 106b is arranged at the top, while cooling medium inlet port 106a is arranged at the bottom. A cooling medium such as water is made to flow through this cooling pipe 106. Rod-shaped member 104 is thereby cooled, so that shaft element 92 which is in contact with this member 104 is cooled. Furthermore, thin plate 94 that is connected to this shaft element 92 is cooled, so that the temperature of thin plate 94 is lower than the temperature of the gas, which is thereby adjusted to a temperature suited to the solidification of the gas.

Figure 7B:
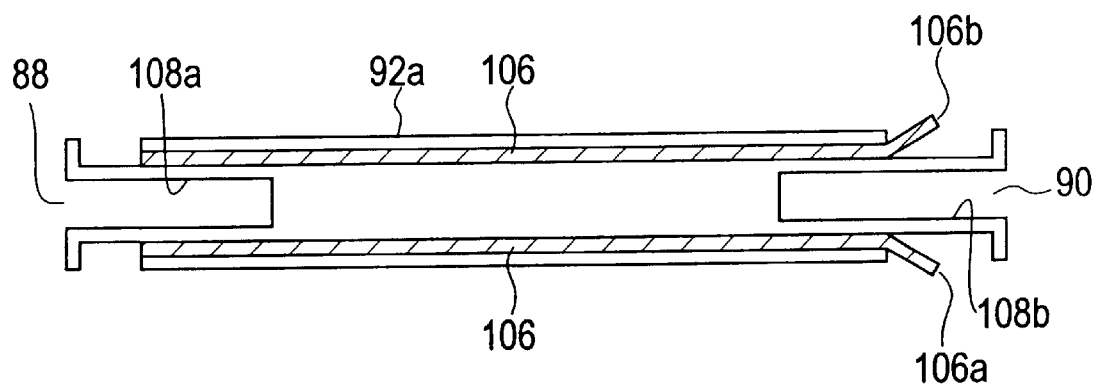

Although in the examples described above the shaft element 92 and cooling mechanism 102 were separate, an integral construction of this shaft element 92 and cooling mechanism 102 could be adopted. For example, as shown in FIG. 7(B), instead of shaft element 92 described above, a shaft element 92a constituted by a solid rod-shaped member with a cooling pipe 106 embedded therein could be employed. At both ends of shaft element 92a shown in FIG. 7(B) there are formed hollow sections 108a and 108b extending along the axial direction of shaft element 92a, respectively, these hollow sections 108a and 108b respectively communicating with gas inlet port 88 and gas outlet port 90. Also, an aperture is formed in the wall surface of shaft element 92a communicating with hollow sections 108a and 108b, the aforementioned hollow sections 108a and 108b thereby respectively communicating with the interior of vessel 86. If such a shaft element 92a is arranged in the interior of the vessel 86, a construction similar to the example described above in which shaft element 92 and cooling mechanism 102 are separately constructed is realized.

Next, the operation of a trap device constructed as described above will be described with reference to FIG. 8. FIG. 8 is a view provided to explain the operation of the trap device of the third embodiment. FIG. 8 shows the flow path within vessel 86 described above. The two line sections extending in the horizontal direction in the upper and lower part of the Figure indicate vessel 86; thin plate 94 is indicated by the plurality of line sections arranged parallel with each other between these line sections. Other structural components such as shaft element 92 are omitted from the drawing. The left side in the Figure is the gas inlet port 88 side; the right side in the Figure is the gas outlet port 90 side. In addition, the arrow symbols in the drawing indicate the direction of flow of the gas.

Gas that is introduced into vessel 86 passes along the flow path and flows from the gas inlet port 88 side towards the gas outlet port 90 side i.e. from the left-hand side in the Figure towards the right-hand side in the Figure. The gas flowing along the main flow path passes in this order through the vicinities of the locations indicated by the symbols a, b, c, d, e, f, g and h in the drawing. Some of the gas flowing along the main flow path passes through the apertures 96 formed in thin plate 94 i.e. the auxiliary flow paths, and flows out into other portions of the main flow path. Some of the gas flowing out from these auxiliary flow paths slows the flow of gas in the main flow path. The dwell time of the gas in the vicinity of the region where the auxiliary flow path and main flow path merge is thereby extended, with the result that accumulation of solids is promoted. In the Figure, the location where accumulation of solids is promoted is indicated by the broken line symbols.

In this way, since the gas flows out downstream and through the apertures 96 of thin plate 94, the entire thin plate 94 is effectively utilized for accumulation of solids. That is, the locations of accumulation of solids are dispersed along the entire flow path corresponding to the positions of apertures 96 of thin plate 94. Although the flow path cross-sectional area diminishes as accumulation of solids progresses accompanying the period of use of the device, the period of use of the device is extended, since local accumulation such as occurred previously cannot occur.

Figure 9:
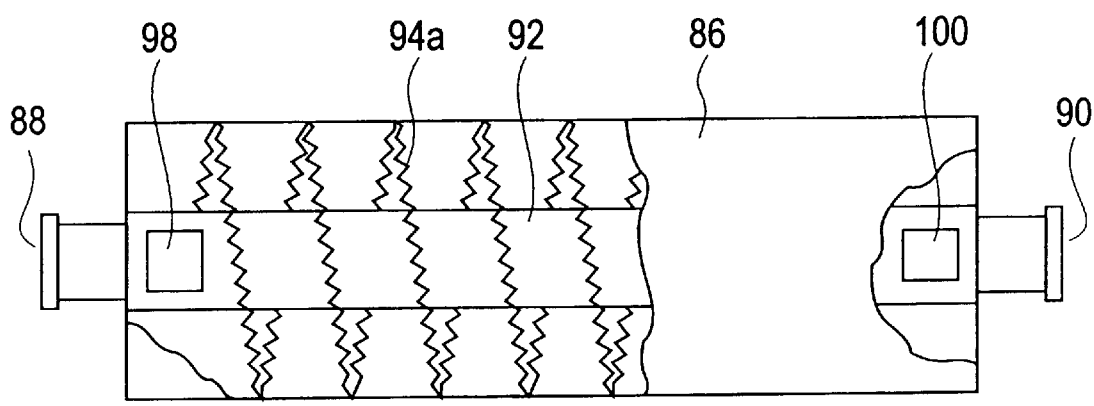
FIG. 9 is a view showing a modification of the trap device of the third embodiment.

A thin plate 94a could be used bent into irregular shape or undulating shape instead of the thin plate 94 in FIG. 8. FIG. 9 is a side view showing a modified example of the trap device of the third embodiment. For example, the cross section of the thin plate 94a may be bent into connected V shapes, connected U shapes or sine wave shapes etc as shown in FIG. 9. Furthermore, an irregular construction may be formed in the surface of thin plate 94a. For example, the surface of thin plate 94a may be formed as an irregular surface by performing blast processing of the surface of thin plate 94a. If the surface area of thin plate 94a is increased in this way, the effective area where solids can be accumulated is increased, and the flow path of the gas is extended. The period of use of the device can therefore be even further extended, and the efficiency of collection of solids can be further improved.

Fourth Embodiment

Figure 10A:
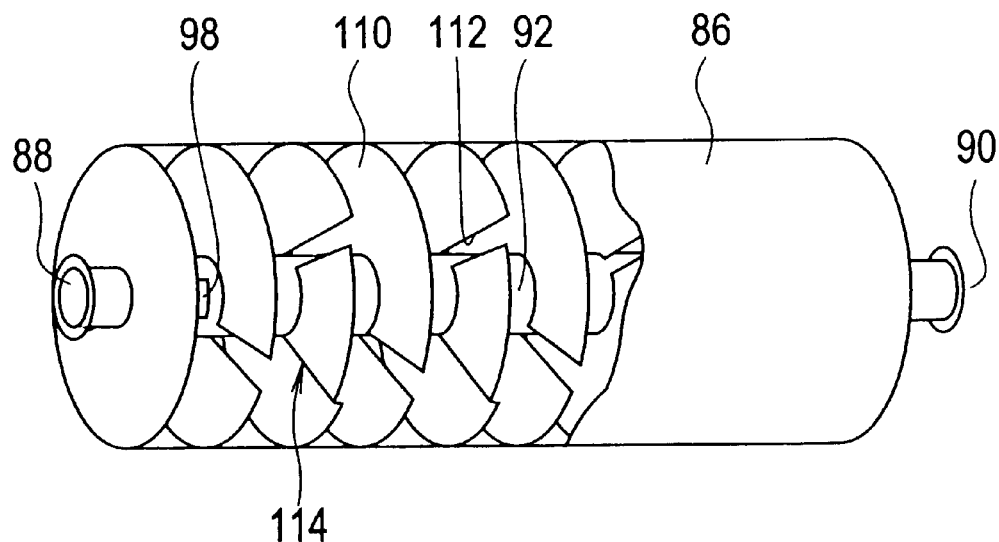
FIG. 10 is a view showing the construction of a trap device according to a fourth embodiment.
Figure 10B:
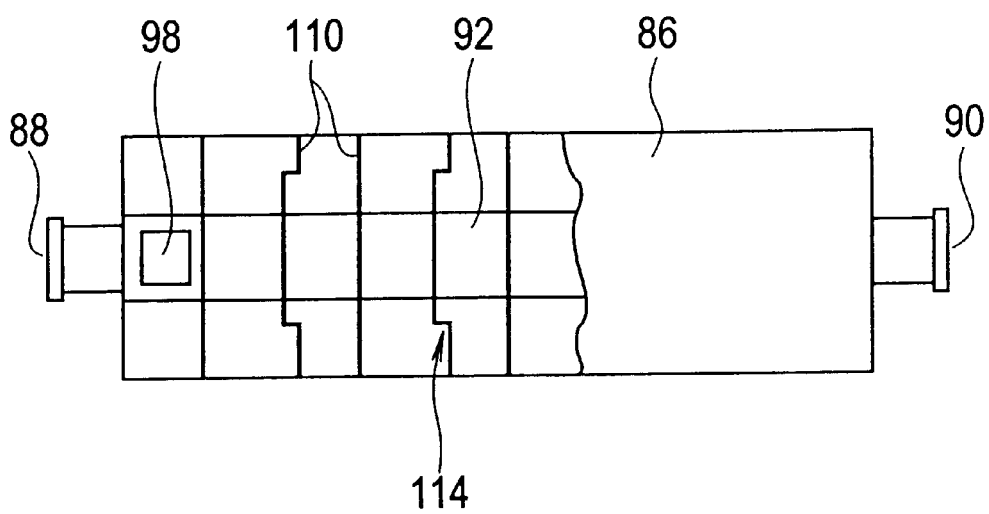

Next, a trap device according to a fourth embodiment will be described. FIG. 10 is a view showing the construction of a trap device according to the fourth embodiment. FIG. 10(A) shows a perspective view of the trap device and FIG. 10(B) shows a side view of the trap device. The structural components which are the same as those described in the third embodiment are given the same reference numerals in FIG. 10.

The trap device of the fourth embodiment comprises a cylindrically shaped vessel (casing) 86 having apertures at both ends. One aperture of this vessel 86 is employed as a gas inlet port 88 and the other aperture of this vessel 86 is employed as a gas outlet port 90. This gas inlet port 88 and gas outlet port 90 are respectively connected to the exhaust path. Also, a gas flow path connected to the exhaust path mentioned above is formed within vessel 86 between gas inlet port 88 and gas outlet port 90.

In the trap device of this embodiment, the gas flow velocity in the flow path referred to above is controlled to a prescribed flow velocity dependent on the position of this flow path. To achieve this, in this fourth embodiment, the flow path referred to above is constituted by a plurality of annular first flow paths and second flow paths connected between each of the first flow paths. Also, the flow path cross-sectional area of these first flow paths is changed at prescribed positions. In the fourth embodiment, the first flow paths referred to above are formed by a plurality of thin plates 110. These thin plates 110 are connected to the surface of cylindrically shaped shaft element 92 provided in the interior of vessel 86. Also, the second flow path referred to above is formed by apertures 112 formed in prescribed positions of thin plates 110 (not shown in FIG. 10(B)). Furthermore, the flow path cross-sectional area of the first flow paths is changed by forming steps 114 at prescribed positions of thin plates 110.

Shaft element 92 referred to above was described in the third embodiment, so the description is not duplicated here. Also, in the interior of shaft element 92, there is provided a cooling mechanism which is the same as that described with reference to FIG. 7 in respect of the third embodiment. Also, at both ends of shaft element 92, there are respectively formed apertures 98 and 100 as described with reference to the third embodiment. Aperture 100 is not shown in FIG. 10.

Each of the thin plates 110 described above are plates extending in annular fashion centered on shaft element 92. Thin plates 110 are arranged along shaft element 92 from the side of gas inlet port 88 to the side of gas outlet port 90. The spaces between adjacent thin plates 110 are used as the first flow path described above.

Also, as described above, a second flow path is formed by apertures 112 formed at prescribed positions of thin plates 110. That is, this second flow path is branched from part of the first flow path and constitutes a flow path connected to another first flow path adjacent to the first-mentioned first flow path. Consequently, gas that is introduced into vessel 86 from gas inlet port 88 flows towards the gas outlet port 90 and flows along second flow paths through the first flow paths.

Also, a step 114 is formed in thin plate 100 by bending at least part of thin plate 110. The size of the gap between the adjacent thin plates 110 changes at the location where such a step 114 is formed. Consequently, the flow path cross-sectional area of the first flow path changes in the region where the step 114 is formed. The conductance of the first flow path changes at the region of the step 114 i.e. the velocity of gas flow changes.

Next, operation of the trap device constructed as described above will be described with reference to FIG. 11. FIG. 11 is a view provided in explanation of the operation of the trap device of the fourth embodiment. FIG. 11 shows the flow paths within vessel 86 described above. The two line sections extending in the horizontal direction in the upper and lower part of the Figure indicate vessel 86; thin plate 110 is indicated by the plurality of line sections arranged parallel with each other between these line sections. Other structural components such as shaft element 92 are omitted from the drawing. The left side in the Figure is the gas inlet port 88 side; the right side in the Figure is the gas outlet port 90 side. In addition, the arrow symbols in the drawing indicate the direction of flow of the gas.

Gas that is introduced into vessel 86 passes along the flow paths i.e. the first flow paths and second flow paths and flows from the gas inlet port 88 side towards the gas outlet port 90 side i.e. from the left-hand side in the Figure towards the right-hand side in the Figure. Gas that has flowed out to the first flow path from the second flow path is branched into two streams so that, for example, the gas flows in mutually opposite directions indicated by symbols a and b in the Figure. The flow path cross-sectional area of the first flow path changes at the location of step 114 of thin plate 110. Where the flow path cross-sectional area is larger, the gas flow velocity is faster, so it is more difficult for accumulation of solids to proceed. Consequently, in these regions, reduction of conductance is prevented. On the other hand, where the flow path cross-sectional area is smaller, the gas flow velocity is lower, so accumulation of solids is promoted. The locations where accumulation of solids is promoted are indicated in the Figure by the broken line symbols.

In this way, since the gas flows out downstream and through the apertures 112 of thin plate 110, the entire thin plate 110 is effectively utilized for accumulation of solids. That is, the locations of accumulation of solids are dispersed along the entire flow path corresponding to the positions of steps 114 of thin plate 110. Although the flow path cross-sectional area diminishes as accumulation of solids progresses accompanying the period of use of the device, the period of use of the device is extended, since local accumulation such as occurred previously cannot occur.

Figure 12:
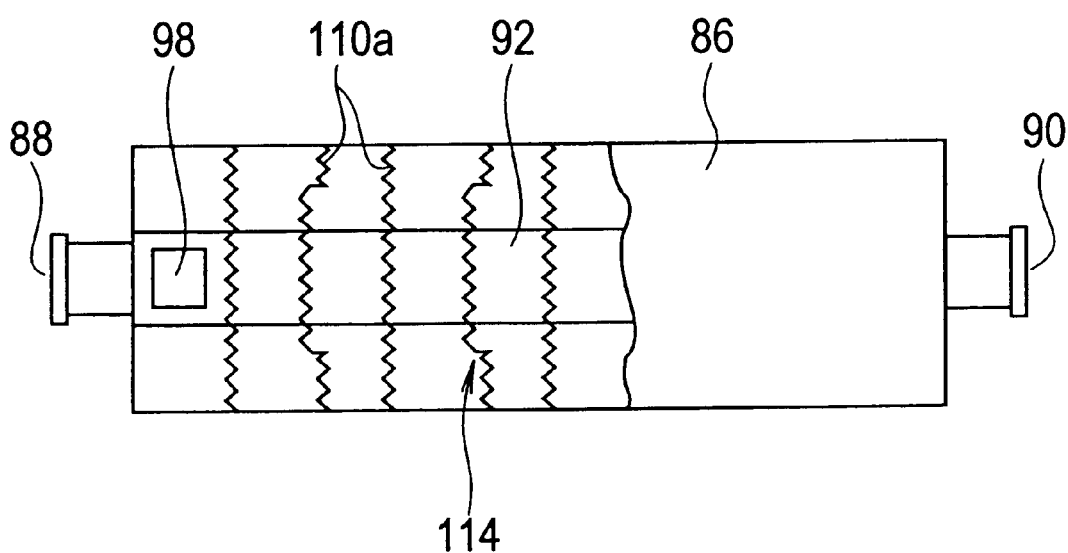
FIG. 12 is a view illustrating a modification of the trap device of the fourth embodiment.
Figure 13A:
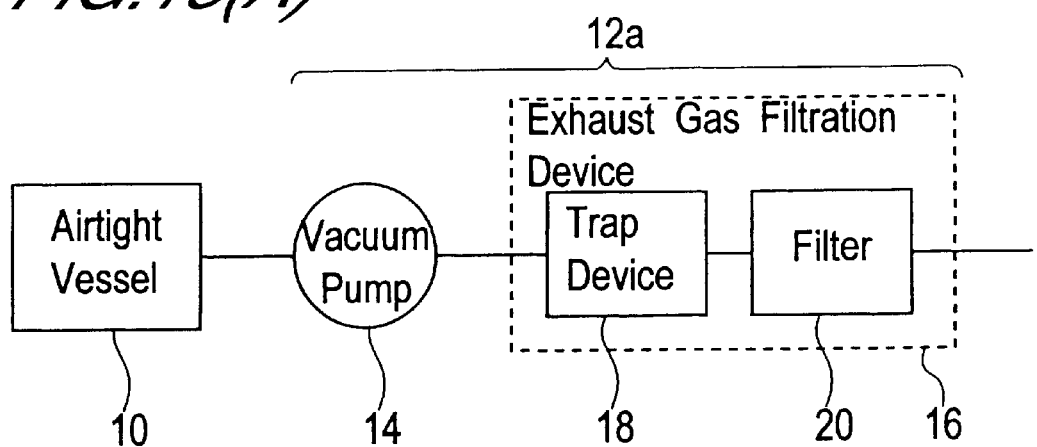
FIG. 13 is a view showing a conventional exhaust gas filtration device.
Figure 13B:
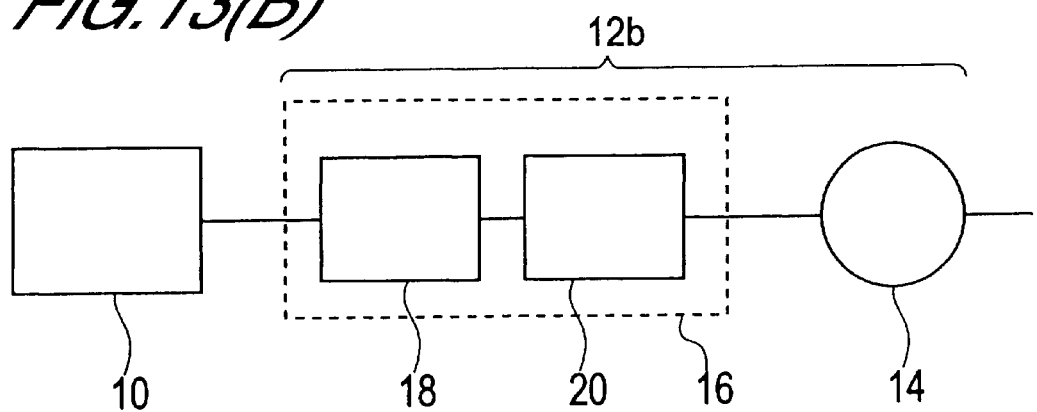

A thin plate 110*a* could be used bent into irregular shape or undulating shape instead of the thin plate 110 in FIG. 10. FIG. 12 is a side view showing a modified example of the trap device of the fourth embodiment. For example, the cross section of the thin plate 110*a* may be bent into connected V shapes, connected U shapes or sine wave shapes etc as shown in FIG. 12. Furthermore, an irregular construction may be formed in the surface of thin plate 110*a*. For example, the surface of thin plate 110*a* may be formed as an irregular surface by performing blast processing of the surface of thin plate 110*a*. If the surface area of thin plate 110*a* is increased in this way, the effective area where solids can be accumulated is increased, and the flow path of the gas is extended. The period of use of the device can therefore be even further extended, and the efficiency of collection of solids can be further improved.

With an exhaust gas filtration device according to the present invention, there is further provided an auxiliary filtration device arranged in the exhaust path between the trap device and the filter.

Thanks to the provision of such an auxiliary filtration device, some of the solids which were difficult to collect and accumulate by the trap device can be removed by this auxiliary filtration device upstream of the filter. Consequently, early blockage of the filter can be prevented, and the life of the exhaust gas filtration device as a whole can be extended.

Also, if an auxiliary filtration device is provided, the conductance of the exhaust path can be lowered to an extent such that the vacuum pump is not damaged. As a result, the flow velocity of exhaust gas in the trap device is lowered i.e. the dwell time of the exhaust gas in the trap device is extended, thereby improving the efficiency of collection of solidification constituents and solids in the trap device.

Also, with the auxiliary filtration device of the present invention, a filter element is arranged in the through-flow path of the exhaust gas, enabling solids in the exhaust gas to be removed by this filter element. Also, the conductance of the position of the exhaust path where the filter element is arranged is lowered due to the provision of a filter element. The flow velocity of the exhaust gas flowing through the exhaust path upstream of the position where the conductance was lowered is therefore reduced. As a result, the collection efficiency of solidification constituents and solids in the other filtration device provided upstream of this auxiliary filtration device is increased.

Also, with the trap device of the present invention, the trap device is constituted by a vessel having in its interior a gas flow path connected to the exhaust path, and the gas flow velocity in the flow path is controlled to a prescribed flow rate in accordance with this flow path position.

Since the gas flow velocity is thus controlled in accordance with flow path position, accumulation of solids is promoted at locations where the flow velocity is comparatively small. On the other hand, accumulation of solids is avoided at locations where the flow velocity is comparatively large. Consequently, it is possible to cause accumulation of solids in prescribed positions of the flow path and to ensure that solids are not accumulated in locations where it is not desired to lower the conductance of the flow path. It is thereby possible to promote accumulation of solids in locations other than the vicinity of the gas inlet port, thereby extending the period of use of the device and also improving the collection efficiency of solids.

If the trap device of the present invention is applied to a plasma CVD device for example for semiconductor manufacture, the operating efficiency and productivity of this CVD device can be improved.

What is claimed is:

1. A trap device arranged on an exhaust path of an airtight vessel evacuated by a vacuum pump, for removing solidified gas as solid in this exhaust path;

wherein said trap device comprises a vessel having in its interior a gas flow path connected to said exhaust path, said flow path comprises a plurality of annular first flow paths and second flow paths connected between said first flow paths, and the flow path cross-sectional area of said first flow paths is changed at certain positions, said first flow path is formed by a plurality of thin plates connected to the surface of a shaft element arranged in the interior of said vessel;

wherein said second flow path is formed by apertures formed in certain positions of said thin plates; and wherein the flow path cross-sectional area of said first flow paths is changed by forming a step at a certain position of said thin plates; and wherein the flow velocity of gas in said flow path is controlled to a certain flow velocity in accordance with position on this flow path.

2. A trap device according to claim 1, wherein said thin plates are bent in irregular fashion.

3. A trap device according to claim 1, wherein said thin plates are bent in undulating fashion.

4. A trap device according to claim 1, wherein an irregular structure is formed in the surface of said thin plates.

5. A trap device according to claim 1, wherein an irregular structure is formed in the surface of said thin plates by blasting.

6. A trap device according to claim 1, wherein a cooling mechanism is provided in the interior of said shaft element.

7. A trap device according to claim 1, wherein said trap device is included in an exhaust gas filtration device which comprises a filter and an auxiliary filtration device; and wherein said trap device, auxiliary filtration device and filter are arranged successively in this order in said exhaust path.

8. A trap device arranged on an exhaust path of an airtight vessel evacuated by a vacuum pump, for removing solidified gas as solid in said exhaust path, comprising a vessel having an inlet and an outlet, a helical plate arranged inside said vessel and defining a helical gas flow path from said inlet to said outlet along which gas flows in helical fashion;

wherein said helical plate is provided with apertures therethrough, said gas flow path on one side of the helical plate being in communication with the gas flow path on another side of the helical plate via said apertures.

9. A trap device as claimed in claim 8, wherein a helical loop part is defined as a 360 degree turn of said helical plate and wherein a single aperture is provided in every helical loop part of said helical plate, without aligning adjacent apertures.

10. A trap device as claimed in claim 9, comprising a cylindrical shaped shaft element connected to said helical plate.

11. A trap device as claimed in claim 10, wherein said single aperture is formed as a slot like opening extending between a surface of said shaft element and an inner wall of said vessel.

12. A trap device as claimed in claim 11, wherein said slot like opening has an increasing width from the surface of said shaft element to the inner wall of said vessel.

13. A trap device according to claim 8, wherein said helical plate is formed by a thin plate; and wherein said thin plate is bent in irregular fashion.

14. A trap device according to claim 8, wherein said helical plate is formed by a thin plate; and wherein said thin plate is bent in undulating fashion.

15. A trap device according to claim 8, wherein said helical plate is formed by a thin plate; and wherein an irregular structure is formed in the surface of said thin plate.

16. A trap device according to claim 8, wherein said helical plate is formed by a thin plate; and wherein an irregular structure is formed in the surface of said thin plate by blasting.

17. A trap device according to claim 8, comprising a cylindrical shaped shaft element connected to said helical plate;

wherein a cooling mechanism is provided in the interior of said shaft element.

18. A trap device according to claim 9, wherein said helical plate is formed by a thin plate; and wherein said thin plate is bent in irregular fashion.

19. A trap device according to claim 9, wherein said helical plate is formed by a thin plate; and wherein said thin plate is bent in undulating fashion.

20. A trap device according to claim 9, wherein said helical plate is formed by a thin plate; and wherein an irregular structure is formed in the surface of said thin plate.

21. A trap device according to claim 9, wherein said helical plate is formed by a thin plate; and wherein an irregular structure is formed in the surface of said thin plate by blasting.

22. A trap device according to claim 9, comprising a cylindrical shaped shaft element connected to said helical plate;

wherein a cooling mechanism is provided in the interior of said shaft element.

23. A trap device according to claim 10, wherein said helical plate is formed by a thin plate; and wherein said thin plate is bent in irregular fashion.

24. A trap device according to claim 10, wherein said helical plate is formed by a thin plate; and wherein said thin plate is bent in undulating fashion.

25. A trap device according to claim 10, wherein said helical plate is formed by a thin plate; and wherein an irregular structure is formed in the surface of said thin plate.

26. A trap device according to claim 10, wherein said helical plate is formed by a thin plate; and wherein an irregular structure is formed in the surface of said thin plate by blasting.

27. A trap device according to claim 10, wherein a cooling mechanism is provided in the interior of said shaft element.

28. A trap device according to claim 11, wherein said helical plate is formed by a thin plate; and wherein said thin plate is bent in irregular fashion.

29. A trap device according to claim 11, wherein said helical plate is formed by a thin plate; and wherein said thin plate is bent in undulating fashion.

30. A trap device according to claim 11, wherein said helical plate is formed by a thin plate; and wherein an irregular structure is formed in the surface of said thin plate.

31. A trap device according to claim 11, wherein said helical plate is formed by a thin plate; and wherein an irregular structure is formed in the surface of said thin plate by blasting.

32. A trap device according to claim 11, wherein a cooling mechanism is provided in the interior of said shaft element.

33. A trap device according to claim 12, wherein said helical plate is formed by a thin plate; and wherein said thin plate is bent in irregular fashion.

34. A trap device according to claim 12, wherein said helical plate is formed by a thin plate; and wherein said thin plate is bent in undulating fashion.

35. A trap device according to claim 12, wherein said helical plate is formed by a thin plate; and wherein an irregular structure is formed in the surface of said thin plate.

36. A trap device according to claim 12, wherein said helical plate is formed by a thin plate; and wherein an irregular structure is formed in the surface of said thin plate by blasting.

37. A trap device according to claim 12, wherein a cooling mechanism is provided in the interior of said shaft element.

38. A trap device arranged on an exhaust path of an airtight vessel evacuated by a vacuum pump, for removing solidified gas as solid in said exhaust path, comprising a vessel defining an interior cavity;

walls arranged in said interior cavity to define annular gas flow paths along which gas flows in annular fashion, said walls being provided with apertures therethrough; and a cylindrical shaped shaft element extending longitudinally through said cavity;

wherein a plurality of annular plates form said walls;

wherein said shaft element connected to said annular plates; and wherein a single aperture is provided in every annular plate without aligning adjacent apertures.

39. A trap device as claimed in claim 38, wherein said single aperture is formed as a slot like opening between a surface of said shaft element and an inner wall of said vessel.

40. A trap device as claimed in claim 39, wherein said slot like opening has an increasing width from the surface of said shaft element to the inner wall of said vessel.

41. A trap device as claimed in claim 38, wherein said walls have steps formed therein at prescribed locations to change a cross-sectional area of said annular gas flow path.

42. A trap device according to claim 38, wherein each of said annular plates is formed by a thin plate; and wherein said thin plates are bent in irregular fashion.

43. A trap device according to claim 38, wherein each of said annular plates is formed by a thin plate; and wherein said thin plates are bent in undulating fashion.

44. A trap device according to claim 38, wherein each of said annular plates is formed by a thin plate; and wherein an irregular structure is formed in the surface of each of said thin plates.

45. A trap device according to claim 38, wherein each of said annular plates is formed by a thin plate; and wherein an irregular structure is formed in the surface of each of said thin plates by blasting.

46. A trap device according to claim 38, herein a cooling mechanism is provided in the interior of said shaft element.

47. A trap device according to claim 39, wherein each of said annular plates is formed by a thin plate; and
wherein said thin plates are bent in irregular fashion.
48. A trap device according to claim 39, wherein each of said annular plates is formed by a thin plate; and
wherein said thin plates are bent in undulating fashion.
49. A trap device according to claim 39, wherein each of said annular plates is formed by a thin plate; and
wherein an irregular structure is formed in the surface of each of said thin plates.
50. A trap device according to claim 39, wherein each of said annular plates is formed by a thin plate; and
wherein an irregular structure is formed in the surface of each of said thin plates by blasting.
51. A trap device according to claim 39, wherein a cooling mechanism is provided in the interior of said shaft element.
52. A trap device according to claim 40, wherein each of said annular plates is formed by a thin plate; and
wherein said thin plates are bent in irregular fashion.
53. A trap device according to claim 40, wherein each of said annular plates is formed by a thin plate; and
wherein said thin plates are bent in undulating fashion.
54. A trap device according to claim 40, wherein each of said annular plates is formed by a thin plate; and
wherein an irregular structure is formed in the surface of each of said thin plates.
55. A trap device according to claim 40, wherein each of said annular plates is formed by a thin plate; and
wherein an irregular structure is formed in the surface of each of said thin plates by blasting.
56. A trap device according to claim 40, wherein a cooling mechanism is provided in the interior of said shaft element.
57. A trap device according to claim 41, wherein each of said annular plates is formed by a thin plate; and
wherein said thin plates are bent in irregular fashion.
58. A trap device according to claim 41, wherein each of said annular plates is formed by a thin plate; and
wherein said thin plates are bent in undulating fashion.
59. A trap device according to claim 41, wherein each of said annular plates is formed by a thin plate; and
wherein an irregular structure is formed in the surface of each of said thin plates.
60. A trap device according to claim 41, wherein each of said annular plates is formed by a thin plate; and
wherein an irregular structure is formed in the surface of each of said thin plates by blasting.
61. A trap device according to claim 41, wherein a cooling mechanism is provided in the interior of said shaft element.
62. A trap device according to claim 8,
wherein said trap device is included in an exhaust gas filtration device which comprises a filter and an auxiliary filtration device; and
wherein said trap device, auxiliary filtration device and filter are arranged successively in this order in said exhaust path.
63. A trap device according to claim 38,
wherein said trap device is included in an exhaust gas filtration device which comprises a filter and an auxiliary filtration device; and
wherein said trap device, auxiliary filtration device and filter are arranged successively in this order in said exhaust path.
64. A trap device according to claim 41,
wherein said trap device is included in an exhaust gas filtration device which comprises a filter and an auxiliary filtration device; and
wherein said trap device, auxiliary filtration device and filter are arranged successively in this order in said exhaust path.
65. A trap device arranged on an exhaust path of an airtight vessel evacuated by a vacuum pump, for removing solidified gas as solid in said exhaust path, comprising
a vessel defining an interior cavity;
walls arranged in said interior cavity to define annular gas flow paths along which gas flows in annular fashion, said walls being provided with apertures therethrough; and
wherein said walls have steps formed therein at prescribed locations to change a cross-sectional area of said annular gas flow path.

* * * * *